United States Patent
Yoshida et al.

(10) Patent No.: US 11,287,707 B2
(45) Date of Patent: Mar. 29, 2022

(54) ARRAY SUBSTRATE, ARRAY SUBSTRATE BODY COMPONENT, AND DISPLAY DEVICE

(71) Applicant: SHARP KABUSHIKI KAISHA, Sakai (JP)

(72) Inventors: Kazuko Yoshida, Sakai (JP); Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 155 days.

(21) Appl. No.: 16/681,436

(22) Filed: Nov. 12, 2019

(65) Prior Publication Data

US 2020/0159077 A1    May 21, 2020

Related U.S. Application Data

(60) Provisional application No. 62/767,708, filed on Nov. 15, 2018.

(51) Int. Cl.
*H01L 23/62* (2006.01)
*G02F 1/1362* (2006.01)
(Continued)

(52) U.S. Cl.
CPC ...... *G02F 1/136204* (2013.01); *G02F 1/1368* (2013.01); *G02F 1/134363* (2013.01);
(Continued)

(58) Field of Classification Search
CPC ......... G02F 1/136204; G02F 1/134363; G02F 1/136286; G02F 1/1368; G02F 1/134318; G02F 1/134372; H01L 27/0292; H01L 27/0296; H01L 27/1225; H01L 27/1244; H01L 27/1255; H01L 29/7869; H01L 27/0266; H01L 29/78669; H01L 27/124; H01L 25/048; H01L 25/167; H01L 27/15;
(Continued)

(56) References Cited

U.S. PATENT DOCUMENTS 5,671,026 A * 9/1997 Shiraki ............... G02F 1/13454
349/40
6,388,719 B1 * 5/2002 Matsunaga ....... G02F 1/136204
349/40
(Continued)

FOREIGN PATENT DOCUMENTS

JP    2010-092036 A    4/2010

*Primary Examiner* — Samuel Park
(74) *Attorney, Agent, or Firm* — ScienBiziP, P.C.

(57) ABSTRACT

An array substrate includes switching components, pixel electrodes connected to the switching components, a common electrode disposed to overlap the pixel electrodes via an insulator, first lines connected to the switching components, second lines connected to the switching components and extending while crossing the first lines, first protection circuits connected to the first lines, respectively, second protection circuits connected to the second lines, respectively, a first common line connected to the first lines via the first protection circuits, and a second common line connected to the second lines via the second protection circuits. The second common line is connected to the first common line directly or indirectly and not being connected to the common electrode.

7 Claims, 16 Drawing Sheets

(51) Int. Cl.
*H01L 27/02* (2006.01)
*H01L 27/12* (2006.01)
*H01L 29/786* (2006.01)
*G02F 1/1343* (2006.01)
*G02F 1/1368* (2006.01)

(52) U.S. Cl.
CPC .... *G02F 1/136286* (2013.01); *H01L 27/0266* (2013.01); *H01L 27/0292* (2013.01); *H01L 27/0296* (2013.01); *H01L 27/1225* (2013.01); *H01L 27/1244* (2013.01); *H01L 27/1255* (2013.01); *H01L 29/7869* (2013.01); *H01L 29/78669* (2013.01); *G02F 1/134318* (2021.01)

(58) Field of Classification Search
CPC ... H01L 27/288; H01L 27/32; H01L 51/0032; H01L 51/05; H01L 51/00; H01L 27/0248; H01L 27/1214; H01L 27/3276; H01L 2924/00; H01L 27/0251; H01L 27/0255; H01L 27/1251
See application file for complete search history.

(56) References Cited

U.S. PATENT DOCUMENTS

| | | | |
|---|---|---|---|
| 2007/0030408 A1* | 2/2007 | Lin | G02F 1/136204 349/40 |
| 2010/0065840 A1 | 3/2010 | Yamazaki et al. | |
| 2010/0084653 A1* | 4/2010 | Yamazaki | H01L 27/124 257/43 |
| 2016/0254257 A1 | 9/2016 | Yamazaki et al. | |
| 2018/0321559 A1* | 11/2018 | Kubota | G02F 1/133707 |
| 2019/0035812 A1* | 1/2019 | Zhang | H01L 27/124 |
| 2019/0317374 A1* | 10/2019 | Yamazaki | G02F 1/13439 |

* cited by examiner

ARRAY SUBSTRATE, ARRAY SUBSTRATE BODY COMPONENT, AND DISPLAY DEVICE

CROSS REFERENCE TO RELATED APPLICATION

This application claims priority from U.S. Provisional Patent Application No. 62/767,708 filed on Nov. 15, 2018. The entire contents of the priority application are incorporated herein by reference.

TECHNICAL FIELD

The technology described herein relates to an array substrate, an array substrate body component, and a display device.

BACKGROUND ART

An example of a display device is described in Japanese Unexamined Patent Application Publication No. 2010-92036. The display device includes a protection circuit including a non-linear element. The non-linear element includes a gate insulating layer covering a gate electrode, a pair of first and second wiring layers whose ends overlap the gate electrode over the gate insulating layer and in which a conductive layer and a second oxide semiconductor layer are stacked, and a first oxide semiconductor layer that overlaps at least the gate electrode and that contacts sides of the gate insulating layer and the conductive layer of the first wiring layer and the second wiring layer and the side and the top of the second oxide semiconductor layer. Over the gate insulating layer, oxide semiconductor layers having different properties are bonded to each other, thereby stable operation can be performed as compared with Schottky junction. Thus, the junction leakage is less likely to be caused and the characteristics of the non-linear element can be improved.

SUMMARY

Liquid crystal panels included in liquid crystal display devices, which are one kind of display devices, include those operate in a fringe field switching (FFS) mode. Such a kind of liquid crystal panel includes pixel electrodes and a common electrode on the array substrate side while having an insulator therebetween, and a fringe electric filed is created between the pixel electrode and the common electrode according to charging of the pixel electrode. However, the technology described in the above document is not based on the liquid crystal panel of the FFS mode. Therefore, in the liquid crystal panel of the FFS mode, technical problems to be solved are present when improving electrostatic discharge (ESD) resistance with using the protection circuit described in the above document and such problems have been hardly to be solved.

The technology described herein was made in view of the above circumstances. An object is to solve problems that are caused in improving ESD resistance in an array substrate including a common electrode.

An array substrate according to the technology described herein includes switching components, pixel electrodes connected to the switching components, a common electrode disposed to overlap the pixel electrodes via an insulator, first lines connected to the switching components, second lines connected to the switching components and extending while crossing the first lines, first protection circuits connected to the first lines, respectively, second protection circuits connected to the second lines, respectively, a first common line connected to the first lines via the first protection circuits, and a second common line connected to the second lines via the second protection circuits. The second common line is connected to the first common line directly or indirectly and not being connected to the common electrode.

An array substrate body component according to the technology described herein includes the above array substrate including array substrates arranged side by side. The first common lines included in the array substrates that are adjacent to each other or the second common lines included in the array substrates that are adjacent to each other are connected to each other.

A display device according to the technology described herein includes the above array substrate, and a counter substrate opposed to the array substrate.

According to the technology described herein, problems that are caused in improving ESD resistance in an array substrate including a common electrode can be solved.

DETAILED DESCRIPTION

First Embodiment

Figure 1:
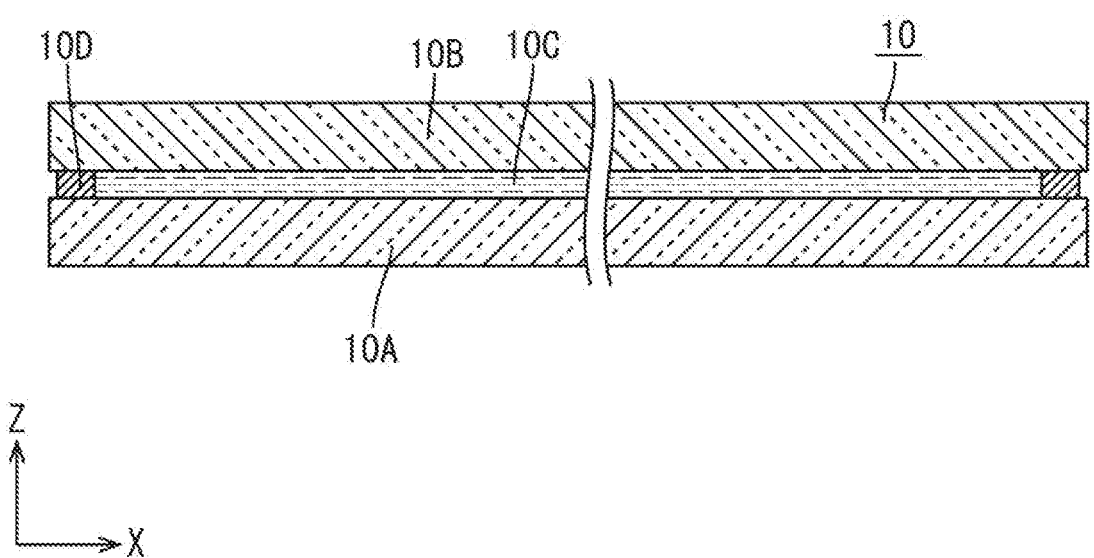
FIG. 1 is a cross-sectional view of a liquid crystal panel according to a first embodiment.

A first embodiment will be described with reference to FIGS. 1 to 10. In this section, a liquid crystal panel (a display panel) 10 and an array substrate 10A included in the liquid crystal panel 10 will be described. In the drawings, X-axes, Y-axes, and Z-axes may be present. The axes in each drawing correspond to the respective axes in other drawings. Upper sides and the lower sides of FIGS. 4 to 11 correspond to the front side and the rear side.

FIG. 1 is a cross-sectional view schematically illustrating the liquid crystal panel 10. As illustrated in FIG. 1, the liquid crystal panel 10 includes the array substrate 10A, a CF substrate 10B (an opposed substrate), a liquid crystal layer 10C, and a sealant 10D. The CF substrate 10B is opposed to the array substrate 10A. The liquid crystal layer 10C is disposed between the substrates 10A and 10B. The sealant 10D surrounds the liquid crystal layer 10C and seals the liquid crystal layer 10C. Polarizing plates are bonded to outer surfaces of the substrates 10A and 10B, respectively.

Figure 2:
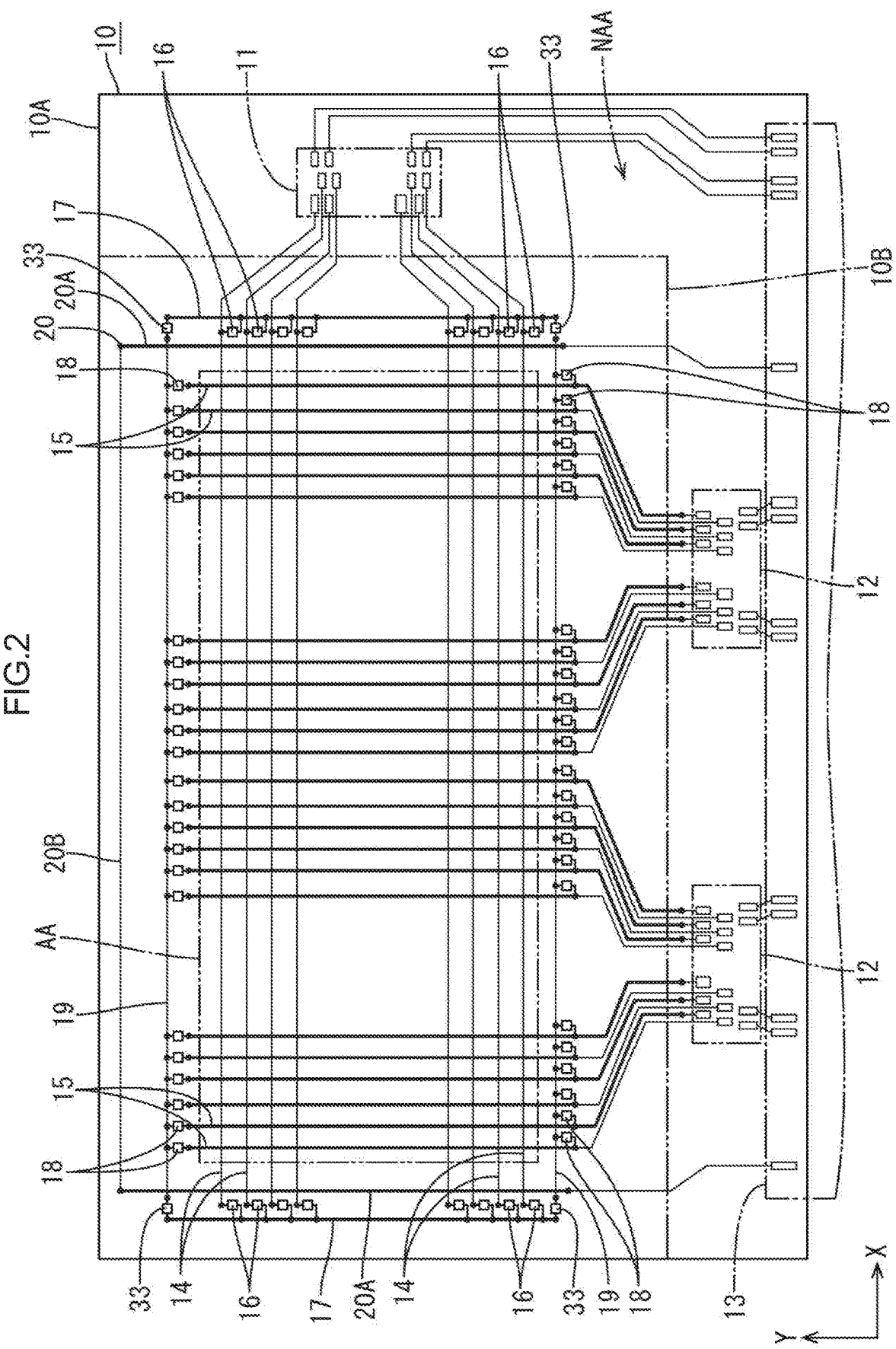
FIG. 2 is a plan view illustrating a circuit structure in an array substrate included in the liquid crystal panel.

As illustrated in FIG. 2, the liquid crystal panel 10 has a laterally-long rectangular overall shape and a long-side direction and a short-side direction thereof match the X-axis direction and the Y-axis direction in each drawing, respectively, and a thickness direction thereof matches the Z-axis direction in each drawing. The liquid crystal panel 10 includes a display surface that includes a display area AA in which images can be displayed and a non-display area NAA in which no image is displayed. The display area AA is a middle section (an area surrounded by a chain line in FIG. 2) of the display surface. The non-display area NAA is an outer peripheral section having a frame shape surrounding the display area AA. FIG. 2 mainly illustrates a circuit structure in the non-display area NAA of the array substrate 10A, and the non-display area NAA is illustrated with a larger area than an actual area. A gate driver 11 and a source driver 12, which are components supplying various kinds of signals related to a display function, are mounted in a section of the non-display area NAA of the array substrate 10A included in the liquid crystal panel 10 adjacent to the display area AA. Each of the gate driver 11 and the source driver 12 is an LSI chip including a driving circuit therein. One gate driver 11 and two source drivers 12 are mounted on the array substrate 10A by the chip-on-glass (COG) mounting method. The gate driver 11 is disposed next to a short-side section of the display area AA and the source drivers 12 are disposed next to a long-side section of the display area AA. The flexible circuit board (a connecting component) 13 is mounted on the long-side section of the non-display area NAA of the array substrate 10A such that the source drivers 12 are present between the flexible circuit board 13 and the display area AA. Various kinds of signals supplied from an external signal supply source are transmitted to the liquid crystal panel 10 through the flexible circuit board 13. Terminals are arranged in a mounting area of the array substrate 10A where the drivers 11, 12 and the flexible circuit board 13 are mounted, and lines that connect the terminals connected to each of the drivers 11, 12 and the terminals connected to the flexible circuit board 13 are arranged in the mounting area.

As illustrated in FIG. 2, gate lines 14 (first lines, scanning lines) and source lines 15 (second lines, data lines) are mounted in the display area AA of the array substrate 10A. The gate lines 14 extend along the X-axis direction. The source lines 15 extend along the Y-axis direction that is perpendicular to the gate lines 14. The gate lines 14 extend such that two end portions thereof in the extending direction reach the non-display display area NAA and one of the two end portions extends to the mounting area of the gate driver 11 and is connected to the gate driver 11. The gate lines 14 are supplied with scanning signals from the gate driver 11. The source lines 15 extend such that two end portions thereof in the extending direction reach the non-display display area NAA and one of the two end portions extends to the mounting area of the source drivers 12 and is connected to the source drivers 12. The source lines 15 are supplied with image signals (data signals) from the source drivers 12.

As illustrated in FIG. 2, gate protection circuits (a first protection circuit) 16 and gate common lines (a first common line) 17 are disposed in the non-display area NAA of the array substrate 10A. The gate protection circuits 16 are connected to the gate lines 14, respectively. The gate common line 17 is connected to the gate lines 14 via the respective gate protection circuits 16. The gate common lines 17 extend along the Y-axis direction so as to be perpendicular to the gate lines 14. A pair of gate common lines 17 are arranged to sandwich the display area AA with respect to the X-axis direction. The gate protection circuits 16 are arranged along the Y-axis direction near the pair of gate common lines 17 (next to two end portions of the gate lines 14). The number of the gate protection circuits 16 arranged in the Y-axis direction is same as the number of the gate lines 14. Similarly, source protection circuits (a second protection circuit) 18 and source common lines (a second common line) 19 are disposed in the non-display area NAA of the array substrate 10A. The source protection circuits 18 are connected to the source lines 15, respectively. The source common line 19 is connected to the source lines 15 via the respective source protection circuits 18. The source common lines 19 extend along the X-axis direction so as to be perpendicular to the source lines 15. A pair of source common lines 19 are arranged to sandwich the display area AA with respect to the Y-axis direction. The source protection circuits 18 are arranged along the X-axis direction near the pair of source common lines 19 (next to two end portions of the source lines 15), respectively. The number of the source protection circuits 18 arranged in the X-axis direction is same as the number of the source lines 15. Detailed configurations of the protection circuits 16, 18 and the common lines 17, 19 will be described later. Common electrode lines 20 are arranged in the non-display area NAA of the array substrate 10A. The common electrode lines 20 include a pair of first common electrode lines 20A and a second common electrode line 20B. The first common electrode lines 20A extend from the terminal that is disposed in the mounting area of the flexible circuit board 13 and extend in parallel to the gate common lines 17. The second common electrode line 20B connects ends of the first common electrode lines 20A that are opposite ends from ends connected to the terminal. The second common electrode line 20B extends in parallel to the source common line 19. Detailed configurations of the common electrode lines 20 will be described later.

Figure 3:
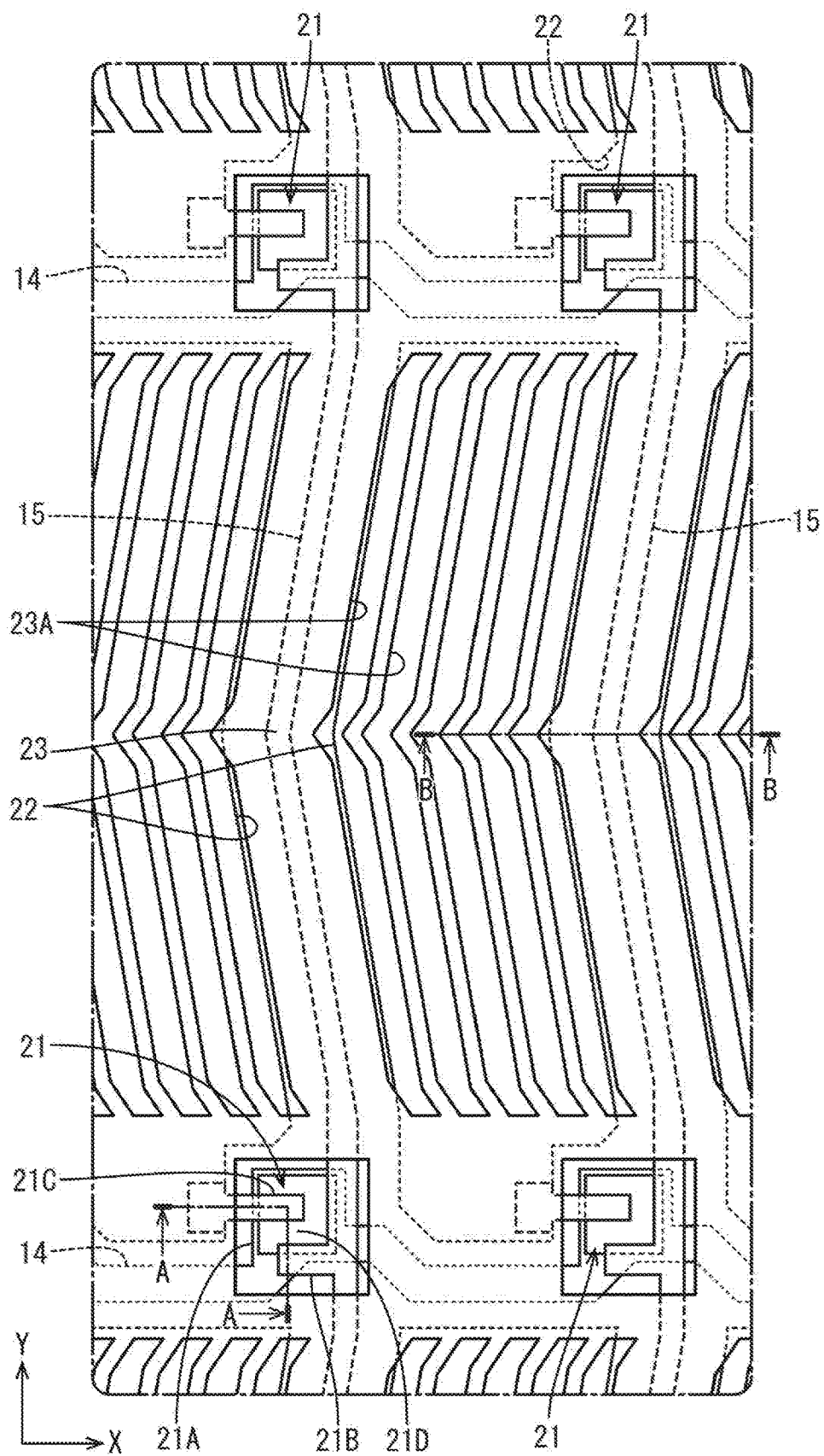
FIG. 3 is a plan view illustrating pixel arrangement in the array substrate.
Figure 4:
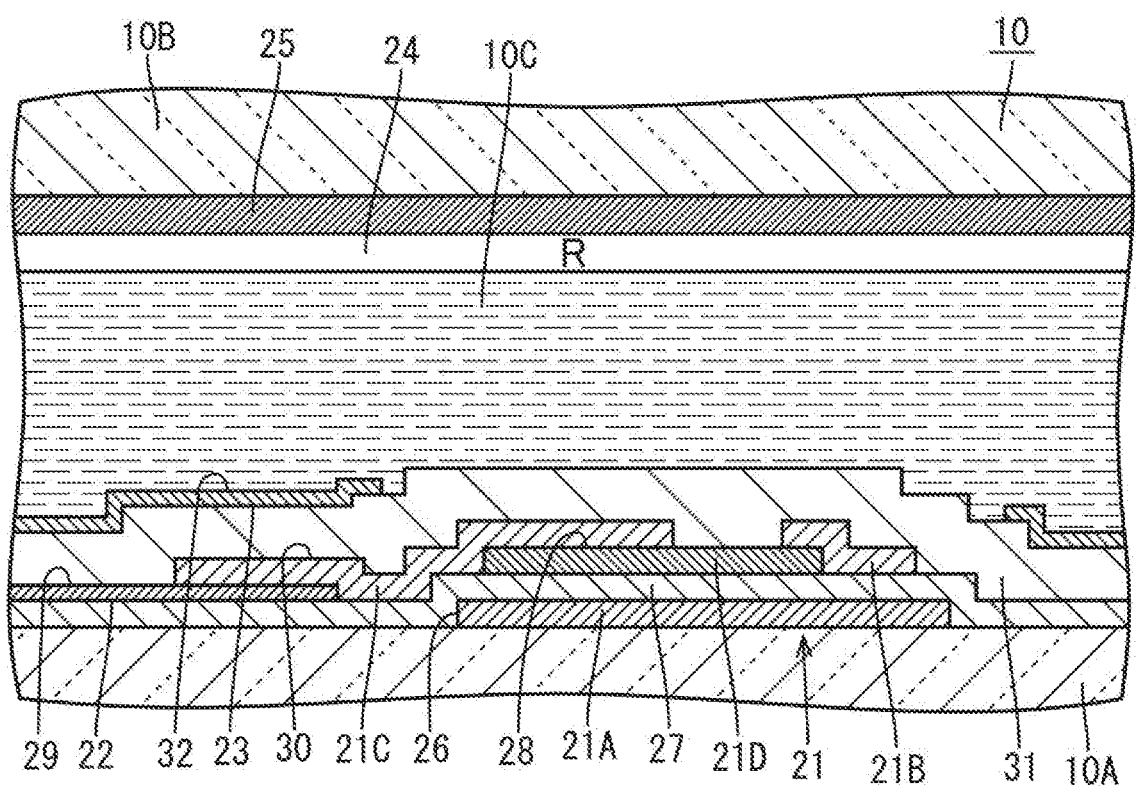
FIG. 4 is a cross-sectional view of the liquid crystal panel along line A-A in FIG. 3.

Next, detailed configurations of the liquid crystal panel 10 within the display area AA will be described with reference to FIGS. 3 to 5. On an inner surface side (a liquid crystal layer 10C side, a surface side opposite the CF substrate 10B) of the array substrate 11A in the display area AA, pixel TFTs (switching components, pixel transistors) 21 and pixel electrodes 22 are arranged in a matrix (columns and rows) in the X-axis direction and in the Y-axis direction. The pixel TFT 21 and the pixel electrode 22 are disposed in each area defined by the gate lines 14 and the source lines 15 that are routed in a grid. The gate lines 14 extend substantially along the X-axis direction while being bent in some portions thereof and the source lines 15 extend substantially along the Y-axis direction while being bent in some portions thereof. The pixel electrode 22 has a substantially vertically elongated rectangular shape and long sides thereof are bent along the source lines 15. As illustrated in FIGS. 3 and 4, the pixel TFT 21 includes a pixel gate electrode 21A that is connected to the gate line 14, a pixel source electrode 21B that is connected to the source line 15, a pixel drain electrode 21C that is connected to an end portion of the pixel electrode 22 with respect to the long-side direction (the Y-axis direction), and a pixel channel region (a semiconductor section) 21D including one end that is connected to the pixel source electrode 21B and another end that is connected to the pixel drain electrode 21C. When the pixel TFTs 21 are driven based on scanning signals supplied to the pixel gate electrodes 21A through the gate lines 14, image signals that are supplied to the pixel source electrodes 21B through the source lines 15 are transmitted to the pixel drain electrodes 21C via the pixel channel regions 11D. As a result, the pixel electrodes 22 are charged to potentials based on the image signals.

Figure 5:
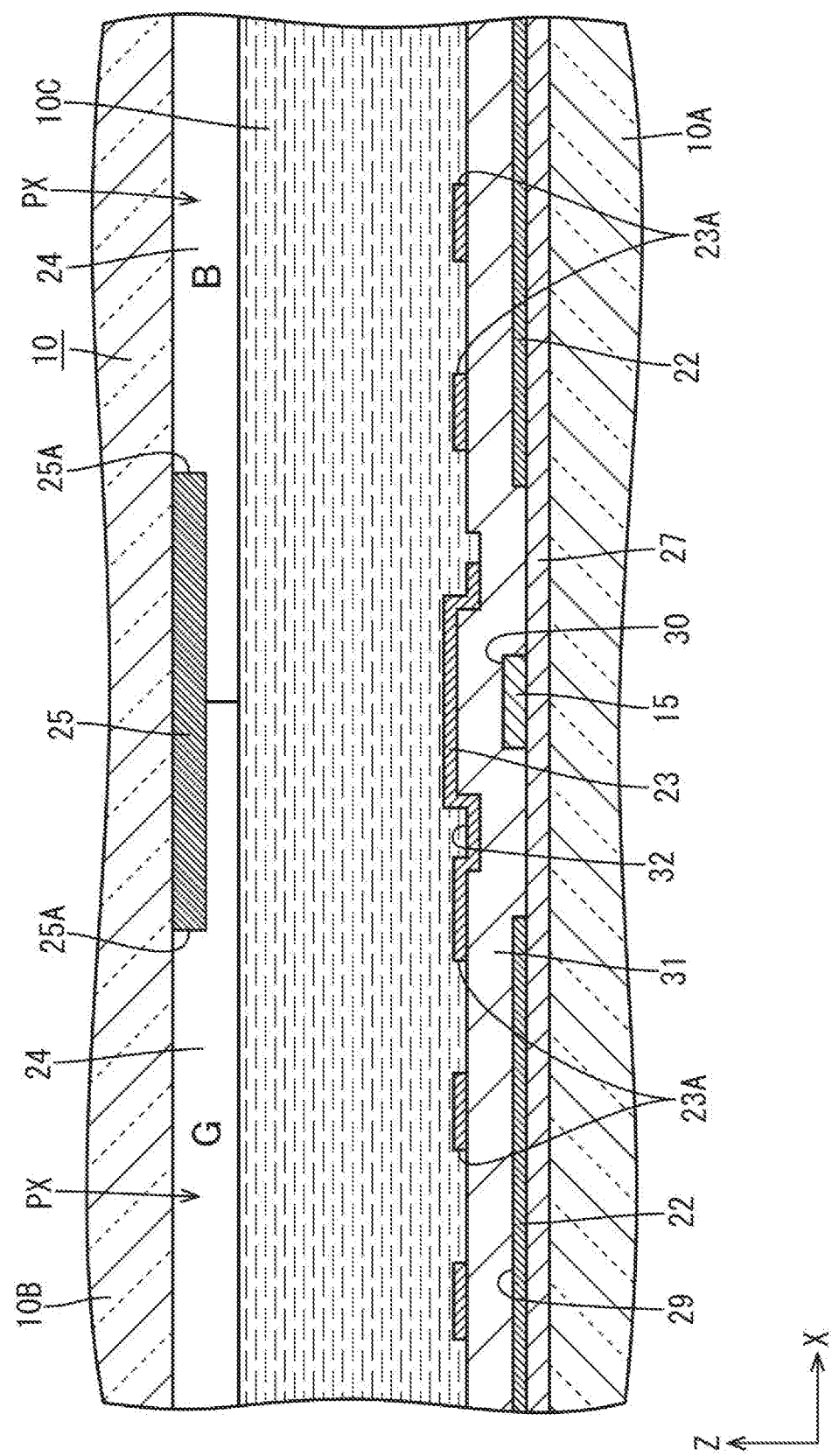
FIG. 5 is a cross-sectional view of the liquid crystal panel along line B-B in FIG. 3.

As illustrated in FIGS. 3 and 5, on an inner surface side of the array substrate 10A in the display area AA, a common electrode 23 is included in a layer upper (closer to the liquid crystal layer 10C) than the pixel electrodes 22 so as to overlap all of the pixel electrodes 22. The common electrode 23 is supplied with a common signal (a reference potential signal) through the common electrode lines 20 such that substantially constant common potential (a reference potential) is applied to the common electrode 23. The common electrode 23 extends over a substantially entire area of the display area AA and includes slits (alignment control slits) 23A in sections thereof overlapping the respective pixel electrodes 22. Each of the slits 23A extends along the long-side direction of each pixel electrode 22. When a potential difference is created between the pixel electrode 22 and the common electrode 23 that overlap each other, a fringe electric field (an oblique electric field) is created between a hole edge of the slit 23A and the pixel electrode 22. The fringe electric field includes a component along a plate surface of the array substrate 10A and a component normal to the plate surface of the array substrate 10A. The alignment of the liquid crystal molecules included in the liquid crystal layer 10C can be controlled with using the fringe electric field. Namely, the liquid crystal panel 10 in this embodiment operates in a fringe field switching (FFS) mode. The specific number of the slits 23A, a specific shape and a specific forming area of the slit 23A may be altered as appropriate other than those illustrated in the drawings.

As illustrated in FIG. 5, color filters 24 of three colors exhibiting blue (B), green (G), and red (R) are disposed on an inner surface side of the DF substrate 10B in the display area AA. The color filters 24 exhibiting different colors are arranged repeatedly along the gate lines 14 (the X-axis direction) and each of the color filters 24 extends along the source lines 15 (substantially the Y-axis direction). The color filters 24 are arranged in stripes as a whole. The color filters 24 are arranged to overlap the respective pixel electrodes 22 on the array substrate 10A side in a plan view. The color filters 24 that are adjacent to each other in the X-axis direction and exhibit different colors are arranged such that a border therebetween (a border between different colors) overlaps the source line 15 and a light blocking section 25, which will be described later. In the liquid crystal panel 10, the color filters 24 of red (R), green (G), and blue (B) filters that are arranged in the X-axis direction and three pixel electrodes 22 that are opposite the respective three color filters 24 form pixels PX of three colors. In the liquid crystal panel 10, the pixels PX of three colors of R, G, and B that area adjacent to each other in the X-axis direction form a display pixel that can display a color image with a certain gradation.

As illustrated in FIGS. 3 and 5, the light blocking section (an inter-pixel light blocking section, a black matrix) 25 that blocks light is disposed on an inner surface side of the CF substrate 10B in the display area AA. The light blocking section 25 substantially forms a grid in a plan view so as to define each of the adjacent pixels PX (the pixel electrodes 22). The light blocking section 25 includes pixel holes 25A in areas overlapping most portions of the pixel electrodes 22 on the array substrate 10A side. The pixel holes 25A are arranged in the X-direction and the Y-axis direction in a matrix within a plate surface area of the CF substrate 10B. Each pixel hole 25A has a substantially vertically-long rectangular shape in a plan view along an outline of the pixel electrode 22. Light transmits through the pixel hole 25A such that an image is displayed. The light blocking section 25 prevents light from traveling between the adjacent pixels PX and ensures independency of gradation of each pixel PX. Particularly, portions of the light blocking section 25 extending along the source lines 15 prevent mixture of different colors that are exhibited by the pixels PX. The light blocking section 25 is disposed to overlap at least the gate lines 14 and the source lines 15 on the array substrate 10A side in a plan view. A planarizing film is disposed above the color filters 24 (on the liquid crystal layer 10C side) in a solid pattern over a substantially entire area of the CF substrate 10B. Alignment films for aligning the liquid crystal molecules included in the liquid crystal layer 10C are disposed on most inner surfaces included in the substrates 10A, 10B that are contacted with the liquid crystal layer 10C.

Various films that are stacked on an inner surface of the array substrate 10A will be described. As illustrated in FIGS. 4 and 5, the array substrate 10A includes a first metal film 26, a gate insulator 27 (an insulator), a semiconductor film 28, a first transparent electrode film 29, a second metal film 30, an interlayer insulator (an insulator, an inter-electrode insulator) 31, and a second transparent electrode film 32. Each of the first metal film 26 and the second metal film 30 has a singly-layer film made of one kind of metal or a multilayer film made of multiple kinds of metals, such as copper, titanium, aluminum, molybdenum, tungsten, or an alloy to have conductivity and a light blocking property. The first metal film 26 includes sections that are configured as the gate lines 14, the pixel gate electrodes 21A of the pixel TFTs 21, the source common lines 19, and a portion of the common electrode line 20 (a portion of the first common electrode line 20A and an entire area of the second common electrode line 20B). The second metal film 30 includes sections that are configured as the source lines 15, the pixel source electrodes 21B of the pixel TFTs 21, the gate common lines 17, and a portion of the common electrode line 20 (a portion of the first common electrode line 20A). The gate insulator 27 and the interlayer insulator 31 are each made of an inorganic material, such as silicon nitride ($SiN_x$) and silicon oxide ($SiO_2$). The gate insulator 27 insulates the first metal film 26, which is included in a lower layer, from the semiconductor film 28, the first transparent electrode film 29, and the second metal film 30, which are included in an upper layer. The interlayer insulator 31 insulates the semiconductor film 28, the first transparent electrode film 29, and the second metal film 30, which are included in the lower layer, from the second transparent electrode film 32, which is included in the upper layer. The semiconductor film 28 includes a thin film made of an oxide semiconductor or an amorphous silicon, for example, and portions thereof configure the pixel channel regions 21D of the pixel TFTs 21. The first transparent electrode film 29 and the second transparent electrode film 32 are made of a transparent electrode material such as indium tin oxide (ITO) and an indium zinc oxide (IZO). The first transparent electrode film 29 includes sections that are configured as the pixel electrodes 22 and others. The second transparent electrode film 32 includes sections that are configured as the common electrode 23 and others.

Figure 6:
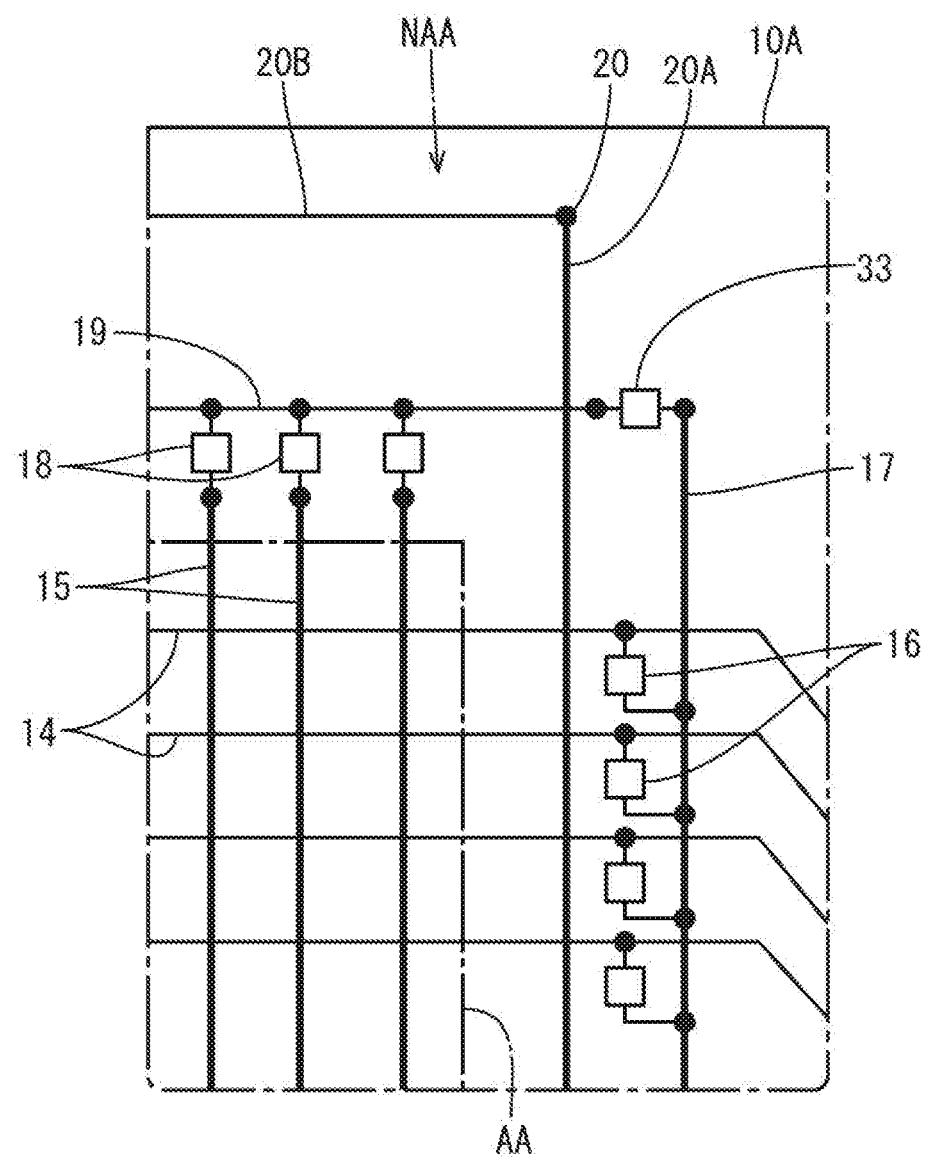
FIG. 6 is a plan view illustrating a circuit structure near a corner section of the array substrate.

Next, the gate protection circuit 16 and the source protection circuit 18 will be described in detail with reference to FIG. 6. In FIGS. 2 and 6, the lines that are sections of the first metal film 26 are illustrated with thin solid lines and the lines that are sections of the second metal film 30 are illustrated with bold solid lines. As illustrated in FIG. 6, the gate protection circuits 16 are connected to the gate lines 14; however, current does not flow through the gate protection circuits 16 by voltage based on the scanning signal supplied to each of the gate lines 14. Therefore, when any of the gate lines 14 that are arranged along the Y-axis direction are supplied with the scanning signal, other gate lines 14 are not short-circuited via the gate protection circuits 16. On the other hand, current flows through the gate protection circuit 16 according to a voltage higher than the voltage based on the scanning signal, for example, a high voltage based on the electro static discharge (ESD). The gate protection circuit 16 has an attenuation operation of such a high voltage. Therefore, when a high voltage caused by ESD is input to any one of the gate lines 14, the high voltage is attenuated via the gate protection circuit 16 and is discharged to the gate common line 17. Accordingly, electrostatic breakdown of the pixel TFTs 21 that are connected to the gate lines 14 are less likely to be caused by a high voltage caused by ESD.

As illustrated in FIG. 6, the source protection circuits 18 are connected to the source lines 15; however, current does not flow through the source protection circuits 18 by voltage based on the scanning signal supplied to each of the source lines 15. Therefore, when the source lines 15 that are arranged along the X-axis direction are supplied with the image signal, the source lines 15 are not short-circuited via the source protection circuits 18. On the other hand, current flows through the source protection circuit 18 according to a voltage higher than the voltage based on the image signal, for example, a high voltage based on the electro static discharge (ESD). The source protection circuit 18 has an attenuation operation of such a high voltage. Therefore, when a high voltage caused by ESD is input to any one of the source lines 15, the high voltage is attenuated via the source protection circuit 18 and is discharged to the source common line 19. Accordingly, electrostatic breakdown of the pixel TFTs 21 that are connected to the source lines 15 are less likely to be caused by a high voltage caused by ESD.

As illustrated in FIG. 6, the gate common lines 17 and the source common lines 19 are electrically connected to each other. In the present embodiment, the gate common lines 17 and the source common lines 19 are indirectly and electrically connected to each other and the array substrate 10A includes common line protection circuits 33 for connecting them. According to such a configuration, if a high voltage caused by ESD is input to one of the gate line 14 and the source line 15, the high voltage is discharged to one of the gate common line 17 and the source common line 19 and further discharged to another one of the gate common line 17 and the source common line 19 through the common line protection circuit 33. Furthermore, the common line protection circuit 33 can attenuate the high voltage caused by ESD. Thus, a high voltage caused by ESD can be dispersed effectively in a wide range and accordingly, the ESD resistance of the pixel TFTs 21 that are connected to the gate lines 14 and the source lines 15 can be improved.

As illustrated in FIG. 6, the gate common lines 17 and the source common lines 19 are electrically connected to each other but are not electrically connected to the common electrode 23. More in detail, the source common lines 19, which are sections of the first metal film 26, cross the section of the first common electrode line 20A of the common electrode line 20 that is connected to the common electrode 23, and the section of the first common electrode line 20A is a section of the second metal film 30. However, the source common line 19 is insulated from the section of the first common electrode line 20A by the gate insulator 27 that is present therebetween (see FIG. 4). The gate common line 17, which is a section of the second metal film 30, is parallel to and spaced from the section of the first common electrode line 20A, which is a section of the second metal film 30, with respect to the X-axis direction. The gate common line 17 and the first common electrode line 20A do not cross. The common electrode 23 is disposed in an upper layer than the pixel electrodes 22 in the array substrate 10A and therefore is easily charged. Particularly, in a process of producing the array substrate 10A, the common electrode 23 is easily charged when the array substrate 10A is removed from a stage of various types of producing devices. If the common electrode 23 is connected to the gate common lines 17 and the source common lines 19, a potential created by the charging of the common electrode 23 may be applied to the gate common lines 17 and the source common lines 19 and further applied to the gate lines 14 and the source lines 15 through the gate protection circuits 16 and the source protection circuits 18. If so, the characteristics of the pixel TFTs 21 that are connected to the gate lines 14 and the source lines 15 are changed. Particularly, if the charging of the common electrode 23 influences each of the gate lines 14 and the source lines 15 in different ways, the characteristics of each pixel TFT 21 may be different in every gate line 14 and every source line 15 to which the pixel TFT 21 is connected. In this respect, the common electrode 23 is not electrically connected to the gate common lines 17 and the source common lines 19. Even if the common electrode 23 is charged in the process of producing the array substrate 10A, a potential created by charging of the common electrode 23 is not applied to the gate lines 14 or the source lines 15 through the gate common lines 17 or the source common lines 19. Accordingly, the characteristics of the pixel TFTs 21 are less likely to be changed due to the charging of the common electrode 23.

Figure 7:
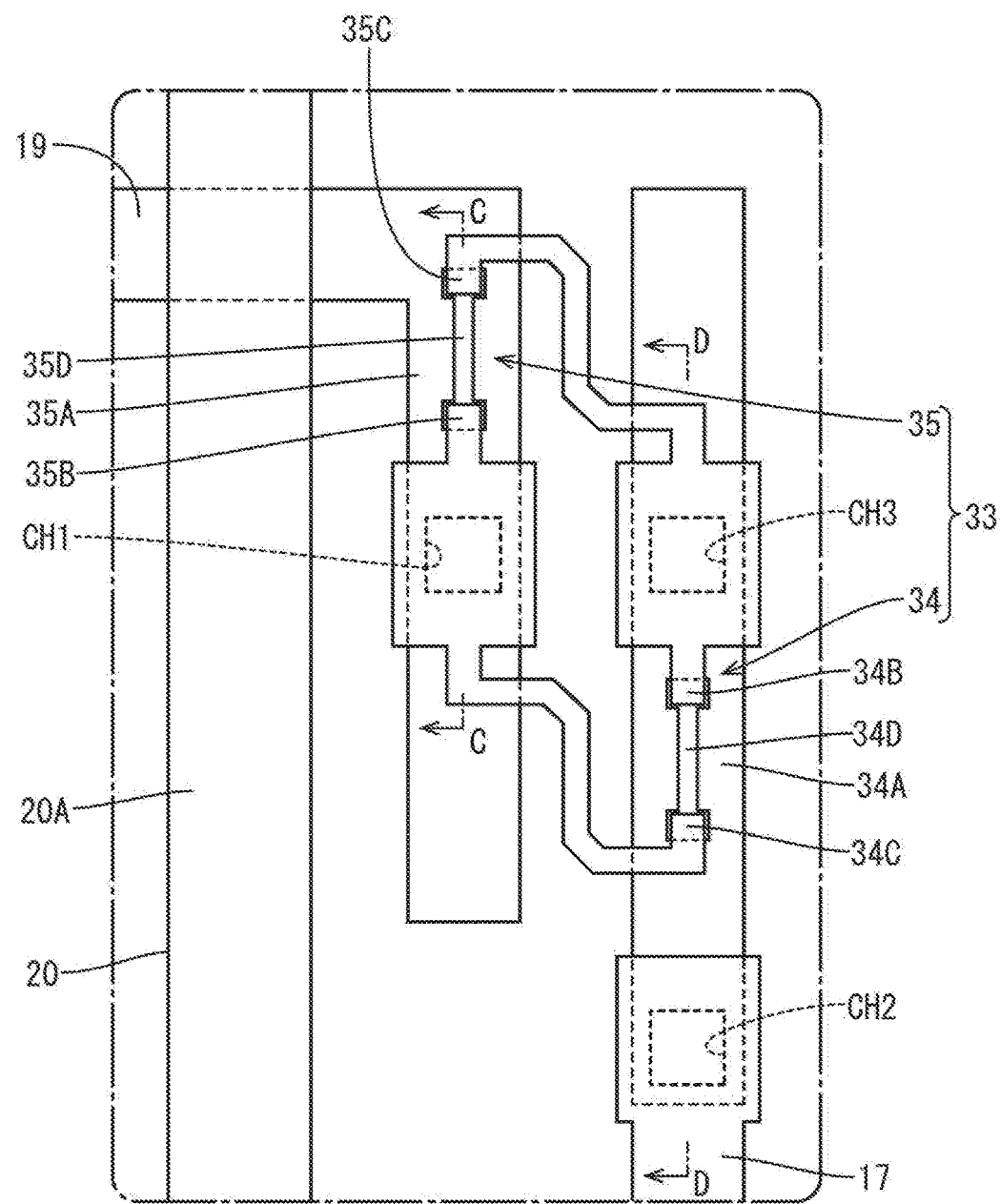
FIG. 7 is a plan view of a common line protection circuit included in the array substrate and therearound.
Figure 8:
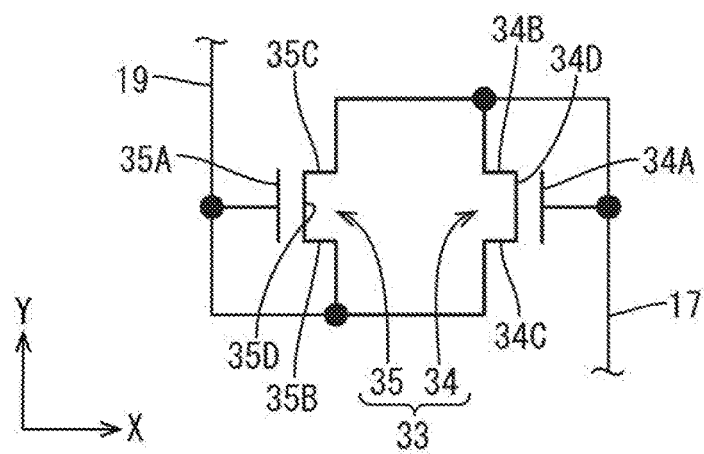
FIG. 8 is a circuit diagram illustrating an electric structure related to the common line protection circuit.
Figure 9:
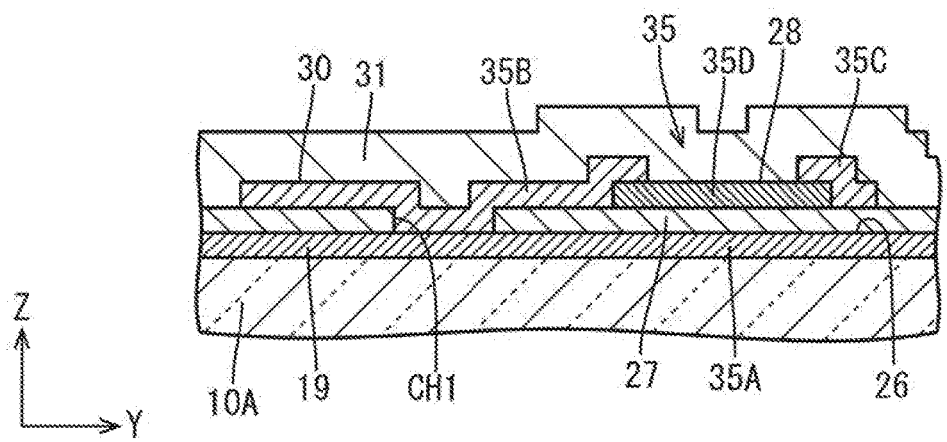
FIG. 9 is a cross-sectional view of the array substrate along line C-C in FIG. 7.
Figure 10:
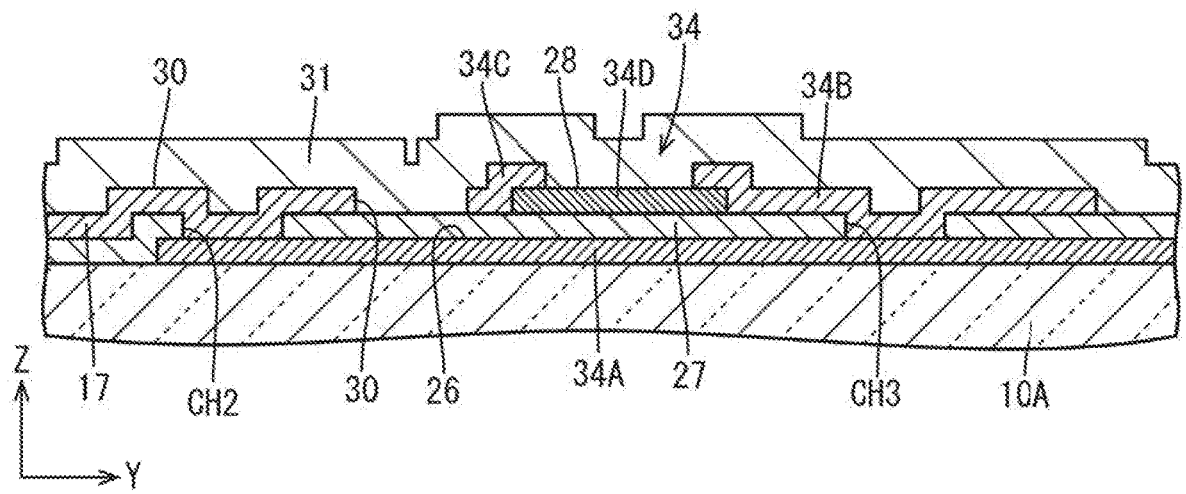
FIG. 10 is a cross-sectional view of the array substrate along line D-D in FIG. 7.

Next, a detailed configuration of the common line protection circuit 33 will be described with reference to FIGS. 7 to 10. As illustrated in FIG. 7 and FIG. 8, the common line protection circuit 33 includes a first TFT (a first transistor) 34 that is connected to the gate common line 17 and a second TFT (a second transistor) 35 that is connected to the source common line 19. The first TFT 34 and the second TFT 35 are formed together with the pixel TFTs 21 disposed in the display area when producing the array substrate 10A. The first TFT 34 includes a first gate electrode 34A, a first source electrode 34B, a first channel region 34D, and a first drain electrode 34C. The first gate electrode 34A and the first source electrode 34B are connected to the gate common line 17. The first channel region 34D is connected to the first source electrode 34B. The first drain electrode 34C is connected to the first channel region 34D at an end thereof opposite from the end connected to the first source electrode 34B. The second TFT 35 includes a second gate electrode 35A, a second source electrode 35B, a second channel region 35D, and a second drain electrode 35C. The second gate electrode 35A and the second source electrode 35B are connected to the source common line 19. The second channel region 35D is connected to the second source electrode 35B. The second drain electrode 35C is connected to the second channel region 35D at an end thereof opposite from the end connected to the second source electrode 35B. The second gate electrode 35A and the second source electrode 35B are connected to the first drain electrode 34C, and the second drain electrode 35C is connected to the first gate electrode 34A and the first source electrode 34B. As illustrated in FIGS. 9 and 10, the first gate electrode 34A and the second gate electrode 35A are sections of the first metal film 26. The first source electrode 34B, the first drain electrode 34C, the second source electrode 35B, and the second drain electrode 35C are sections of the second metal film 30. The first channel region 34D and the second channel region 35D are sections of the semiconductor film 28 and are disposed to overlap the first gate electrode 34A and the second gate electrode 35A, respectively, from the upper layer side via the gate insulator 27. As illustrated in FIG. 9, the source common line 19 and the second gate electrode 35A, which are sections of the first metal film 26, are connected to the second source electrode 35B, which is a section of the second metal film 30, through a first contact hole CH in the gate insulator 27. On the other hand, as illustrated in FIG. 10, the sections of the gate common line 17, which are sections of the second metal film 30, are connected to the first gate electrode 34A, which is a section of the first metal film 26, through a second contact hole CH2 in the gate insulator 27. The first gate electrode 34A, which is a section of the first metal film 26, is connected to the first source electrode 34B, which is a section of the second metal film 30, through a third contact hole CH3 in the gate insulator 27.

According to the common line protection circuit 33 having such a configuration, operations and advantageous effects described below are obtained. If a high voltage caused by ESD is input to the gate line 14 and supplied to the gate common line 17 via the gate protection circuit 16, a voltage that is greater than a threshold voltage is applied to the first gate electrode 34A from the gate common line 17 and the first TFT 34 is driven, as illustrated in FIGS. 7 and 8. Since the gate common line 17 is connected to the first source electrode 34B, the high voltage caused by ESD is supplied from the first source electrode 34B to the first drain electrode 34C through the first channel region 34D. Since the first drain electrode 34C is connected to the second gate electrode 35A and the second source electrode 35B, the second TFT 35 is driven by the high voltage that is supplied to the first drain electrode 34C. Then, the high voltage caused by ESD is supplied from the second source electrode 35B to the second drain electrode 35C through the second channel region 35D. On the other hand, since the first drain electrode 34C is also connected to the source common line 19, the high voltage is discharged to the source common line 19. If a high voltage that is caused by ESD and input to the source line 15 is supplied to the source common line 19 via the source protection circuit 18, a voltage that is greater than a threshold voltage is applied to the second gate electrode 35A from the source common line 19 and the second TFT 35 is driven. Since the source common line 19 is connected to the second source electrode 35B, the high voltage caused by ESD is supplied from the second source electrode 35B to the second drain electrode 35C via the second channel region 35D. Since the second drain electrode 35C is connected to the first gate electrode 34A and the first source electrode 34B, the first TFT 34 is driven by the high voltage that is supplied to the second drain electrode 35C. Then, the high voltage caused by ESD is supplied from the first source electrode 34B to the first drain electrode 34C via the first channel region 34D. On the other hand, since the second drain electrode 35C is also connected to the gate common line 17, the high voltage is discharged to the gate common line 17. As described before, the first TFT 34 and the second TFT 35 that have opposite rectifying directions are continued to be driven until the high voltage becomes the threshold voltage or lower. Thus, attenuation of the high voltage is performed.

Each of the gate protection circuit 16 and the source protection circuit 18 includes the first TFT 34 and the second TFT 35 similarly to the common line protection circuit 33, although the details thereof are not illustrated. The first TFT 34 and the second TFT 35 included in each of the gate protection circuit 16 and the source protection circuit 18 are configured such that the threshold voltage thereof is higher than the voltage of the scanning signal and higher than a highest value of the voltage of the image signal. The first TFT 34 included in the gate protection circuit 16 is connected to the gate line 14 and the second TFT 35 included in the gate protection circuit 16 is connected to the gate common line 17. The first TFT 34 included in the source protection circuit 18 is connected to the source line 15 and the second TFT 35 included in the source protection circuit 18 is connected to the source common line 19.

As described earlier, the array substrate 10A in this embodiment includes the pixel TFTs (the switching components) 21, the pixel electrodes 22 connected to the pixel TFTs 21, the common electrode 23, the gate lines (first lines) 14, the source lines (second lines) 15, the gate protection circuits (first protection circuits) 16, the source protection circuits (second protection circuits) 18, the gate common line (a first common line) 17, and the source common line (a second common line) 19. The common electrode 23 is disposed to overlap the pixel electrodes 22 while having the interlayer insulator 31, which is an insulator, therebetween. The gate lines 14 are connected to the respective pixel TFTs 21. The source lines 15 are connected to the respective pixel TFTs 21 and extend and cross the gate lines 14. The gate protection circuits 16 are connected to the respective gate lines 14. The source protection circuits 18 are connected to the respective source lines 15. The gate common line 17 is connected to the gate lines 14 via the gate protection circuits 16. The source common line 19 is connected to the source lines 15 via the source protection circuits 18 and is connected indirectly to the gate common line 17 but not connected to the common electrode 23.

According to such a configuration, the pixel TFTs 21 are driven based on the signals transmitted through the gate lines 14 and the source lines 15 and the pixel electrodes 22 are charged accordingly. The pixel electrodes 22 are disposed to overlap the common electrode 23 while having the interlayer insulator 31, which is the insulator, therebetween. Therefore, an electric field is created between the pixel electrodes 22 and the common electrode 23. The gate lines 14 are connected to the gate common line 17 via the gate protection circuits 16. Therefore, if a high voltage caused by ESD is input to one of the gate lines 14, the high voltage is discharged to the gate common line 17 while being attenuated by the gate protection circuit 16. Similarly, the source lines 15 are connected to the source common line 19 via the second protection circuits. Therefore, if a high voltage caused by ESD is input to one of the source lines 15, the high voltage is discharged to the source common line 19 while being attenuated by the source protection circuit 18. The gate common line 17 and the source common line 19 are indirectly connected to each other. The high voltage that is discharged from one of the gate line 14 and the source line 15 to one of the gate common line 17 and the source common line 19 is discharged to another one of the gate common line 17 and the source common line 19. Accordingly, the high voltage caused by ESD can be dispersed effectively in a wide range and the ESD resistance of the pixel TFT 21 can be improved.

On the other hand, the common electrode 23 is not connected to the gate common line 17 and the source common line 19. Therefore, even if the common electrode 23 is charged during the producing process, a potential created by the charging of the common electrode 23 is not applied to the gate line 14 or the source line 15 via the gate common line 17 or the source common line 19. If the common electrode 23 is connected to the gate common line 17 and the source common line 19, a potential created by the charging of the common electrode 23 is applied to the gate common line 17 and the source common line 19 and is further applied to the gate line 14 and the source line 15 via the gate protection circuit 16 and the source protection circuit 18. If so, the characteristics of the pixel TFTs 21 that are connected to the gate lines 14 and the source lines 15 are changed. Particularly, if the charging of the common electrode 23 influences each of the gate lines 14 and the source lines 15 in different ways, the characteristics of each pixel TFT 21 may be different by every gate line 14 and every source line 15 to which the pixel TFT 21 is connected. In this respect, the common electrode 23 is not electrically connected to the gate common lines 17 and therefore, the source common lines 19 and the characteristics of the pixel TFTs 21 are less likely to be changed due to the charging of the common electrode 23. Thus, the ESD resistance of the pixel TFT 21 can be improved and problems that are caused by the charging of the common electrode 23 are to be solved.

Further, the common line protection circuit 33 is disposed between the gate common line 17 and the source common line 19 to connect them but is not connected to the common electrode 23. According to such a configuration, a high voltage that is discharged from one of the gate line 14 and the source line 15 to one of the gate common line 17 and the source common line 19 is discharged to another one of the gate common line 17 and the source common line 19 while being attenuated by the common line protection circuit 33. Compared to a configuration in which the gate common line 17 is directly connected to the source common line 19, the ESD resistance of the pixel TFT 21 can be improved by attenuation of the high voltage by the common line protection circuit 33.

The common line protection circuit 33 at least includes the first TFT (the first transistor) 34 and the second TFT (the second transistor) 35. The first TFT 34 includes the first gate electrode 34A and the first source electrode 34B that are connected to the gate common line 17, the first channel region 34D, and the first drain electrode 34C. The first channel region 34D is connected to the first source electrode 34B. The first drain electrode 34C is connected to the first channel region 34D at an end thereof opposite from the end connected to the first source electrode 34B. The second TFT 35 includes the second gate electrode 35A and the second source electrode 35B that are connected to the source common line 19 and the first drain electrode 34C, the second channel region 35D, and the second drain electrode 35C. The second channel region 35D is connected to the second source electrode 35B. The second drain electrode 35C is connected to the second channel region 35D at an end thereof opposite from the end connected to the second source electrode 35B. According to such a configuration, if a high voltage caused by ESD is input to the gate common line 17, the first TFT 34 whose first gate electrode 34A and first source electrode 34B are connected to the gate common line 17 is driven and the high voltage is applied from the first source electrode 34B to the first drain electrode 34C via the first channel region 34D. The first drain electrode 34C is connected to the second gate electrode 35A and the second source electrode 35B. Therefore, the second TFT 35 is driven by the high voltage input to the first drain electrode 34C and the high voltage is input to the second drain electrode 35C from the second source electrode 35B via the second channel region 35D. On the other hand, since the first drain electrode 34C is also connected to the source common line 19, the high voltage is discharged to the source common line 19. If the high voltage caused by ESD is input to the source common line 19, for example, the second TFT 35 whose second gate electrode 35A and second source electrode 35B are connected to the source common line 19 is driven and the high voltage is input to the second drain electrode 35C from the second source electrode 35B via the second channel region 35D. Since the second drain electrode 35C is connected to the first gate electrode 34A and the first source electrode 34B, the first TFT 34 is driven by the high voltage that is input to the second drain electrode 35C and the high voltage is input from the first source electrode 34B to the first drain electrode 34C via the first channel region 34D. On the other hand, since the second drain electrode 35C is also connected to the gate common line 17, the high voltage is discharged to the gate common line 17. As described before, the first TFT 34 and the second TFT 35 that have opposite rectifying directions are continued to be driven until the high voltage becomes the threshold voltage or lower. Thus, attenuation of the high voltage is performed.

The common electrode 23 is disposed in an upper layer than the pixel electrodes 22. With such a configuration, the insulator is not disposed between the pixel electrodes 22 and the pixel drain electrodes 21C and therefore, a contact hole is not necessary to be formed in the insulator to connect the pixel electrode 22 and the pixel drain electrode 21C. This simplifies the producing process. Compared to a configuration including the common electrode 23 in a lower layer than the pixel electrodes 22, the common electrode 23 is likely to be charged during the producing process. However, the common electrode 23 is not connected to the gate common line 17 and the source common line 19 via the common line protection circuit 33. Therefore, even if the common electrode 23 is charged, the characteristics of the pixel TFTs 21 are less likely to be changed due to the charging.

The liquid crystal panel (the display device) 10 in this embodiment includes the array substrate 10A described earlier and the CF substrate (a counter substrate) 10B that is disposed opposite the array substrate 10A. According to such a liquid crystal panel 10, the ESD resistance of the pixel TFTs 21 is improved and the characteristics of the pixel TFTs 21 are less likely to be changed due to the charging of the common electrode 23. This improves reliability and display quality.

Second Embodiment

A second embodiment will be described with reference to FIGS. 11 to 13. The second embodiment includes a common line protection circuit 133 having a configuration different from that of the first embodiment. Configurations, operations, and effects similar to those of the first embodiment previously described will not be described.

Figure 11:
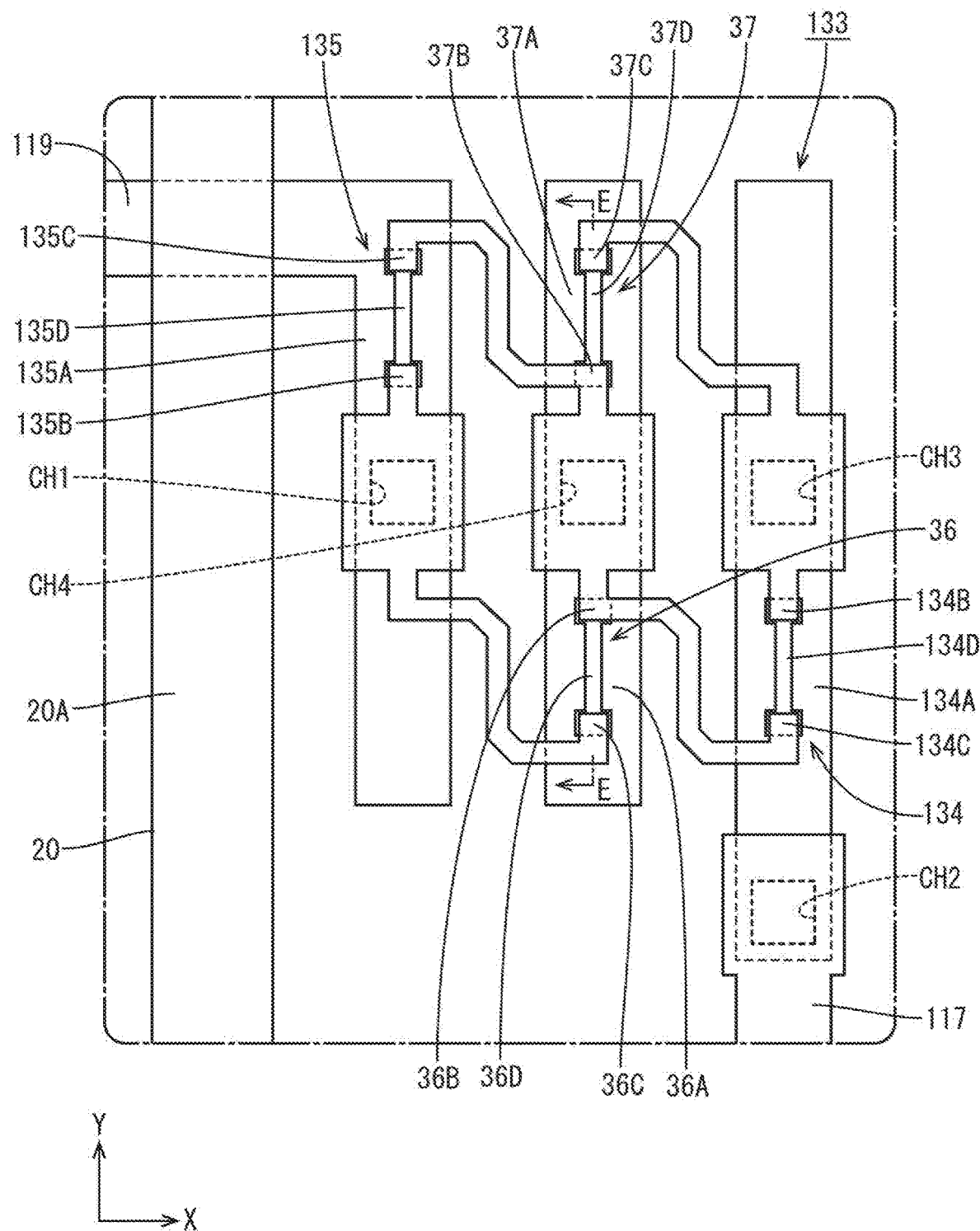
FIG. 11 is a plan view of a common line protection circuit included in the array substrate and therearound according to a second embodiment.
Figure 12:
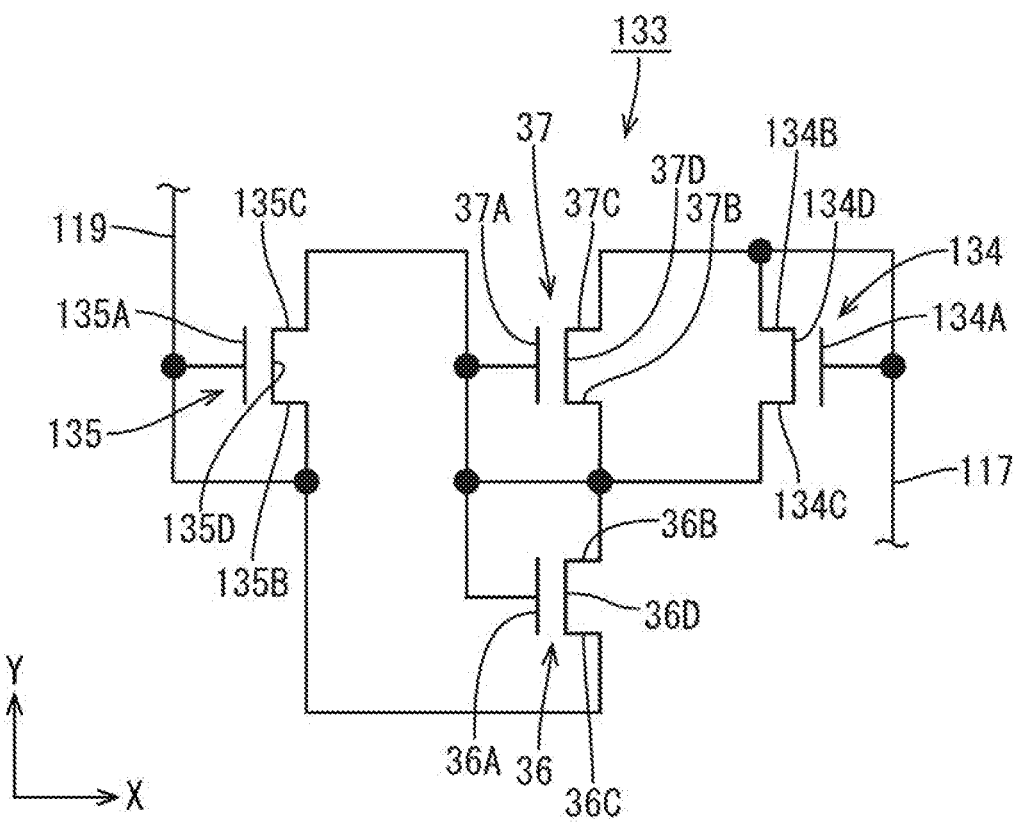
FIG. 12 is a circuit diagram illustrating an electric structure related to the common line protection circuit.
Figure 13:
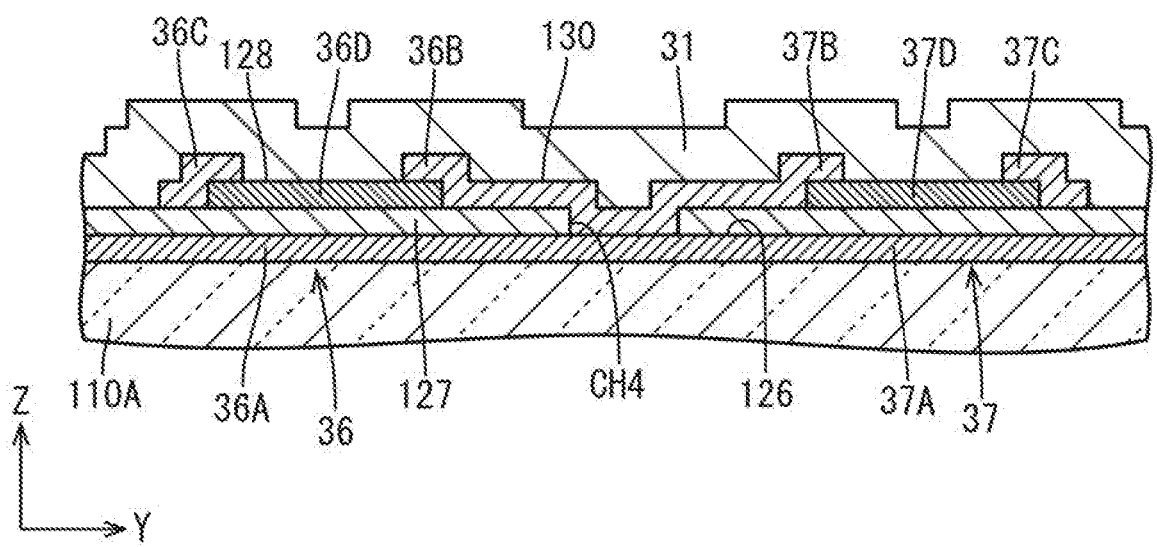
FIG. 13 is a cross-sectional view of the array substrate along line E-E in FIG. 11.

As illustrated in FIGS. 11 and 12, the common line protection circuit 133 includes a third TFT (a third transistor) 36 and a fourth TFT (a fourth transistor) 37 in addition to a first TFT 134 and a second TFT 135 that are similar to those of the first embodiment previously described. The third TFT 36 and the fourth TFT 37 are formed together with the first TFT 134, the second TFT 135, and the pixel TFT when producing an array substrate 110A. The third TFT 36 includes a third gate electrode 36A, a third source electrode 36B, a third drain electrode 36C, and a third channel region 36D. The third gate electrode 36A and the third source electrode 36B among the above are connected to a first drain electrode 134C and a second drain electrode 135C. The third drain electrode 36C is connected to a second source electrode 135B. The third channel region 36D is connected to the third source electrode 36B at one end thereof and connected to the third drain electrode 36C at another end thereof. The fourth TFT 37 includes a fourth gate electrode 37A, a fourth source electrode 37B, a fourth drain electrode 37C, and a fourth channel region 37D. The fourth gate electrode 37A and the fourth source electrode 37B among the above are connected to the first drain electrode 134C, the second drain electrode 135C, the third gate electrode 36A, and the third source electrode 36B. The fourth drain electrode 37C is connected to the first source electrode 134B. The fourth channel region 37D is connected to the fourth source electrode 37B at one end thereof and connected to the fourth drain electrode 37C at another end thereof. As illustrated in FIG. 12, the third gate electrode 36A and the fourth gate electrode 37A are sections of a first metal film 126. The third source electrode 36B, the third drain electrode 36C, the fourth source electrode 37B, and the fourth drain electrode 37C are sections of a second metal film 130. The third channel region 36D and the fourth channel region 37D are sections of a semiconductor film 128 and are disposed to overlap the third gate electrode 36A and the fourth gate electrode 37A, respectively, from the upper layer side while having a gate insulator 127 therebetween. The third gate electrode 36A and the fourth gate electrode 37A, which are sections of the first metal film 126, are connected to the third source electrode 36B and the fourth source electrode 37B, which are sections of the second metal film 130, respectively, through a fourth contact hole CH4 formed in the gate insulator 127.

According to the common line protection circuit 133 having such a configuration, operations and advantageous effects described below are obtained. If a high voltage caused by ESD is input to the gate line 114 and input to the gate common line 117 via the gate protection circuit 116, the first TFT 134 is driven and accordingly, the high voltage caused by ESD is input from the gate common line 117 to the first drain electrode 134C via the first source electrode 134B and the first channel region 134D, as illustrated in FIGS. 11 and 12. Since the first drain electrode 134C is connected to the third gate electrode 36A, the third source electrode 36B, the fourth gate electrode 37A, and the fourth source electrode 37B, the third TFT 36 and the fourth TFT 37 are driven. Then, the high voltage caused by ESD is input from the third source electrode 36B to the third drain electrode 36C via the third channel region 36D and also input from the fourth source electrode 37B to the fourth drain electrode 37C via the fourth channel region 37D. Since the third drain electrode 36C is connected to the second gate electrode 135A and the second source electrode 135B of the second TFT 135, the second TFT 135 is driven. Accordingly, the high voltage caused by ESD is input from the second source electrode 135B to the second drain electrode 135C via the second channel region 135D. On the other hand, since the second source electrode 135B is connected to the source common line 119, the high voltage is discharged to the source common line 119. If a high voltage caused by ESD is input to the source line 115 and input to the source common line 119 via the source protection circuit 118, the second TFT 135 is driven and accordingly, the high voltage caused by ESD is input from the source common line 119 to the second drain electrode 135C via the second source electrode 135B and the second channel region 135D. Since the second drain electrode 135C is connected to the third gate electrode 36A, the third source electrode 36B, the fourth gate electrode 37A, and the fourth source electrode 37B, the third TFT 36 and the fourth TFT 37 are driven. Then, the high voltage caused by ESD is input from the third source electrode 36B to the third drain electrode 36C via the third channel region 36D and the high voltage is also input from the fourth source electrode 37B to the fourth drain electrode 37C via the fourth channel region 37D. Since the fourth drain electrode 37C is connected to the first gate electrode 134A and the first source electrode 134B of the first TFT 134, the first TFT 134 is driven and accordingly, the high voltage caused by ESD is input from the first source electrode 134B to the first drain electrode 134C via the first channel region 134D. On the other hand, since the first source electrode 134B is connected to the gate common line 117, the high voltage is discharged to the gate common line 117. As described before, the third TFT 36 and the fourth TFT 37 that have opposite rectifying directions are continued to be driven until the high voltage becomes the threshold voltage or lower. Thus, attenuation of the high voltage is performed.

As described earlier, according to the present embodiment, the common line protection circuit 133 at least includes the third TFT (the third transistor) 36 and the fourth TFT (the fourth transistor) 37. The third TFT 36 includes the third gate electrode 36A and the third source electrode 36B that are connected to the first drain electrode 134C and the second drain electrode 135C, the third channel region 36D that is connected to the third source electrode 36B, and the third drain electrode 36C. The third drain electrode 36C is connected to the third channel region 36D at an end thereof opposite from the end to which the third source electrode 36B is connected and the third drain electrode 36C is connected to the second source electrode 135B. The fourth TFT 37 includes the fourth gate electrode 37A, the fourth source electrode 37B, the fourth channel region 37D, and the fourth drain electrode 37C. The fourth gate electrode 37A and the fourth source electrode 37B are connected to the source common line 19. The second channel region 35D is connected to the first drain electrode 134C, the second drain electrode 135C, the third gate electrode 36A, and the third source electrode 36B. The fourth channel region 37D is connected to the fourth source electrode 37B. The fourth drain electrode 37C is connected to the fourth channel region 37D at an end thereof opposite from the end connected to the fourth source electrode 37B. According to such a configuration, if a high voltage caused by ESD is input to the gate common line 117, the first TFT 134 is driven and the high voltage is input from the first drain electrode 134C to the third gate electrode 36A and the third source electrode 36B of the third TFT 36, and the fourth gate electrode 37A and the fourth source electrode 37B of the fourth TFT 37. Then, the third TFT 36 and the fourth TFT 37 are driven and the high voltage is input from the third source electrode 36B to the third drain electrode 36C via the third channel region 36D, and the high voltage is input from the fourth source electrode 37B to the fourth drain electrode 37C via the fourth channel region 37D. Since the third drain electrode 36C is connected to the second gate electrode 135A and the second source electrode 135B of the second TFT 135, the second TFT 135 is driven and the high voltage is input from the second source electrode 135B to the second drain electrode 135C via the second channel region 135D. On the other hand, since the second source electrode 135B is connected to the source common line 119, the high voltage is discharged to the source common line 119. If a high voltage caused by ESD is input to the source common line 119, for example, the second TFT 135 is driven and the high voltage is input from the second drain electrode 135C to the third gate electrode 36A and the third source electrode 36B of the third TFT 36, and the fourth gate electrode 37A and the fourth source electrode 37B of the fourth TFT 37. Then, the third TFT 36 and the fourth TFT 37 are driven and the high voltage is input from the third source electrode 36B to the third drain electrode 36C via the third channel region 36D, and the high voltage is also input from the fourth source electrode 37B to the fourth drain electrode 37C via the fourth channel region 37D. Since the fourth drain electrode 37C is connected to the first gate electrode 134A and the first source electrode 134B of the first TFT 134, the first TFT 134 is driven and the high voltage is input from the first source electrode 134B to the first drain electrode 134C via the first channel region 134D. On the other hand, since the first source electrode 134B is connected to the gate common line 117, the high voltage is discharged to the gate common line 117. As described earlier, the third TFT 36 and the fourth TFT 37 that have opposite rectifying directions are continued to be driven until the high voltage becomes the threshold voltage or lower. Thus, attenuation of the high voltage is performed.

Third Embodiment

A third embodiment will be described with reference to FIG. 14 or FIG. 15. The third embodiment includes an auxiliary capacitance line 38 and an auxiliary capacitance common line 39 in addition to the configuration described in the first embodiment. Configurations, operations, and effects similar to those of the first embodiment previously described will not be described.

Figure 14:
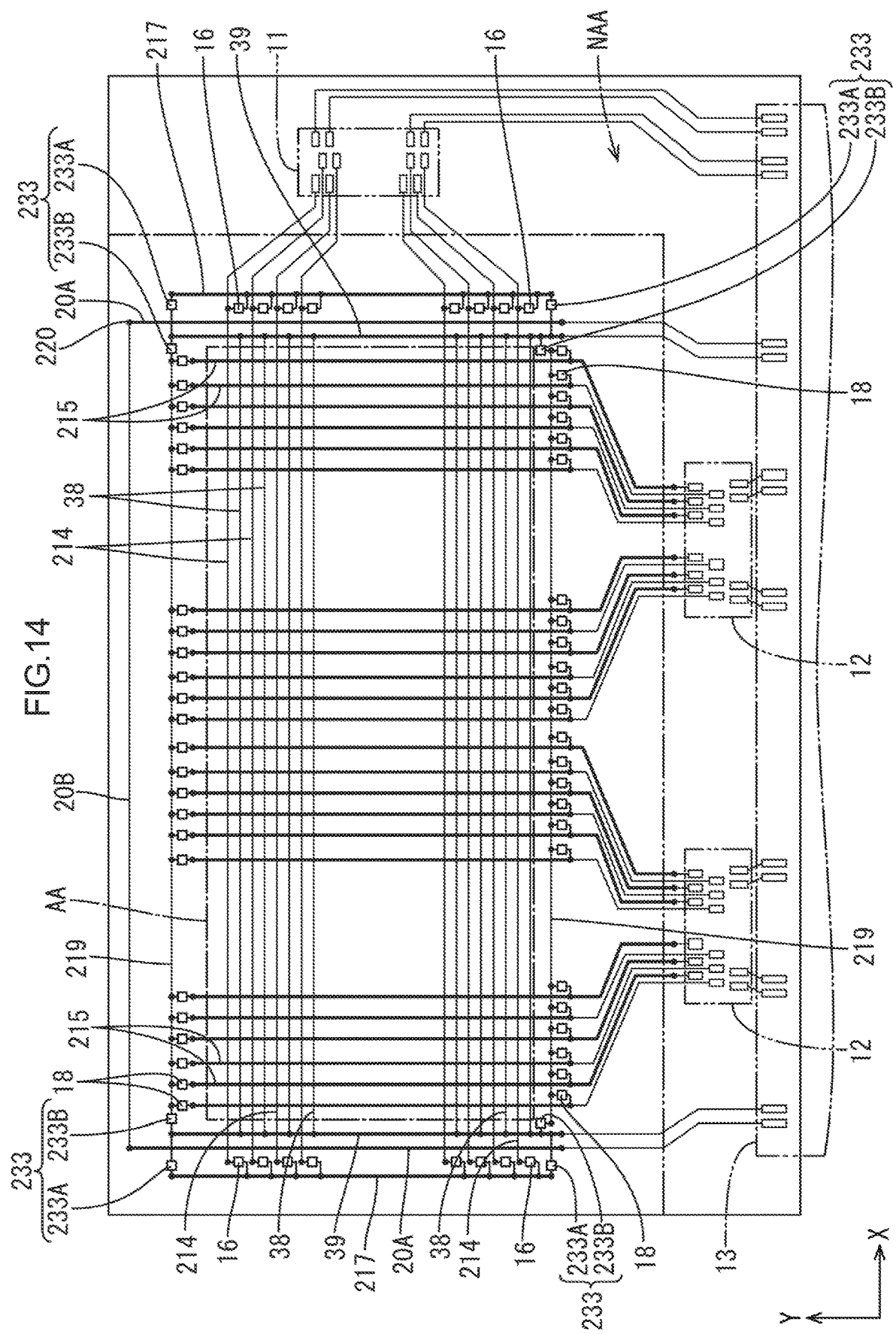
FIG. 14 is a plan view illustrating a circuit structure in an array substrate according to a third embodiment.

As illustrated in FIG. 14, an array substrate 210A in this embodiment includes the auxiliary capacitance lines (third lines) 38 and the auxiliary capacitance common lines (third common lines) 39. The auxiliary capacitance lines 38 cross the source lines 215 and extend in parallel to the gate lines 214. The auxiliary capacitance common line 39 is connected to each of the auxiliary capacitance lines 38. More in detail, the auxiliary capacitance line 38 extends so as to cross all of the pixel electrodes that are arranged along the X-axis direction in the display area AA. The auxiliary capacitance line 38 is a section of a first metal film similar to the gate lines 214 and is disposed to overlap the pixel electrodes that are arranged along the X-axis direction while having a gate insulator therebetween. An electrostatic capacitance (auxiliary capacitance) is created between the auxiliary capacitance line and the pixel electrode to maintain a potential that is charged in the pixel electrode. The auxiliary capacitance lines 38 are arranged such that each auxiliary capacitance line 38 is away from the gate line 214 at a space shorter than a long-side dimension of the pixel electrode. The gate lines 214 and the auxiliary capacitance lines 38 are arranged alternately and repeatedly at intervals with respect to the Y-axis direction. The number of the auxiliary capacitance lines 38 that are arranged in the Y-axis direction is substantially equal to the number of the gate lines 214. The auxiliary capacitance common lines 39 extend along the Y-axis direction and cross the gate lines 214 in the non-display area NAA. A pair of the auxiliary capacitance common lines 39 sandwich the display area AA from both sides with respect to the X-axis direction. The pair of the auxiliary capacitance common lines 39 are connected to the respective two end portions of the auxiliary capacitance lines 38 that are arranged in the Y-axis direction, and the two end portions are extended portions of the auxiliary capacitance lines 38 that are extended to the non-display area NAA. The auxiliary capacitance common lines 39 are sections of the second metal film similar to the source lines 215 and connected directly to each auxiliary capacitance line 38 through a contact hole in the gate insulator. The auxiliary capacitance common line 39 is supplied with the common signal that is also supplied to a common electrode line 220, and accordingly, the each auxiliary capacitance line 38 is maintained at a potential same as that of a common electrode.

Figure 15:
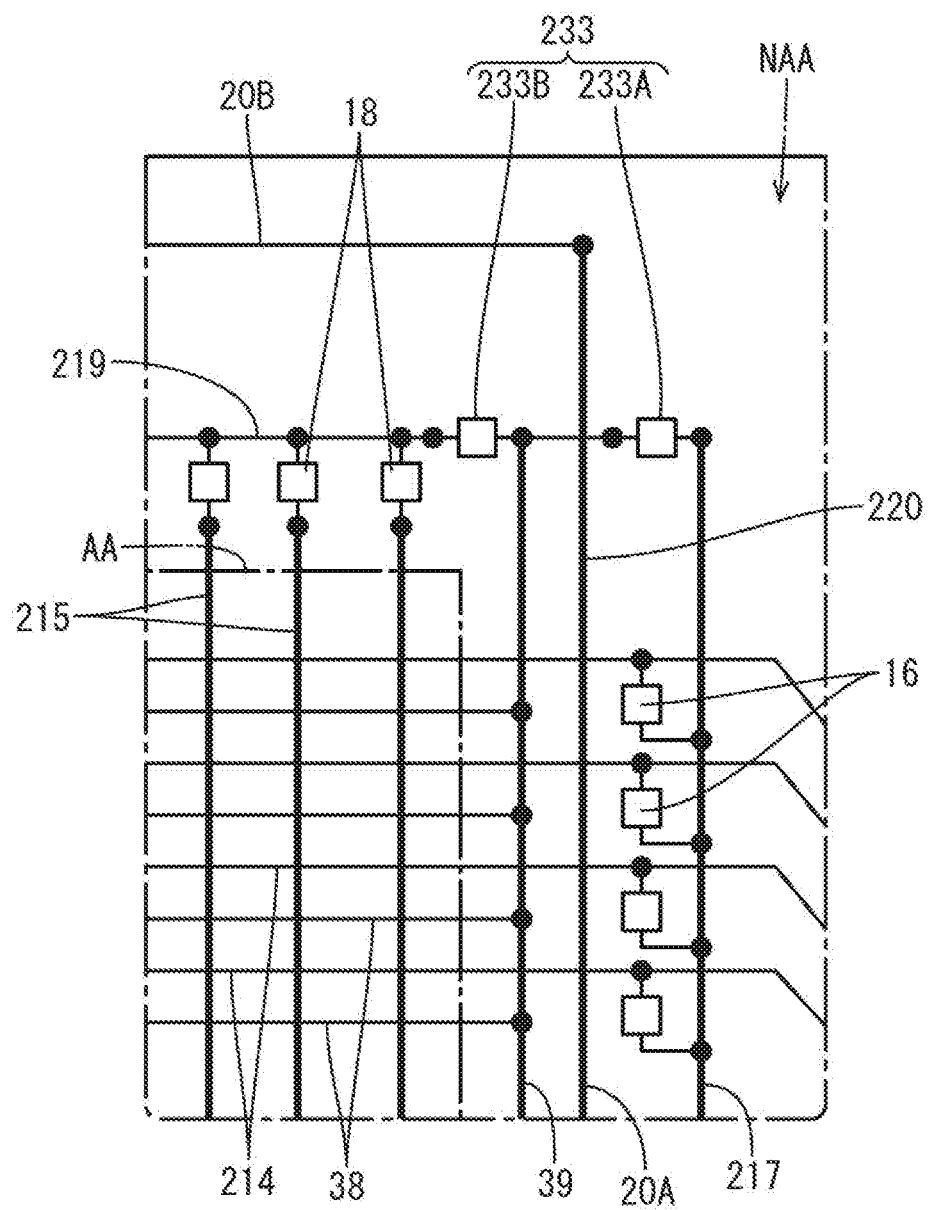
FIG. 15 is a plan view illustrating a circuit structure near a corner section of the array substrate.

As illustrated in FIG. 15, the auxiliary capacitance common line 39 is indirectly connected to a gate common line 217 and a source common line 219 via a common line protection circuit 233 but is not connected to the common electrode line 220. In detail, the common line protection circuit 233 includes a first common line protection circuit 233A that is connected to the gate common line 217 and a second common line protection circuit 233B that is connected to the source common line 219. The first common line protection circuit 233A is present between the auxiliary common line 39 and the gate common line 217 and is connected to both of the lines. The second common line protection circuit 233B is present between the auxiliary common line 39 and the source common line 219 and is connected to both of the lines. The auxiliary capacitance common line 39 is connected to both of the first common line protection circuit 233A and the second common line protection circuit 233B. In other words, the gate common line 217 and the source common line 219 are connected to each other indirectly via the first common line protection circuit 233A, the second common line protection circuit 233B, and the auxiliary capacitance common line 39. According to such a configuration, if a high voltage caused by ESD is input to any one of the gate lines 214, the source lines 215, and the auxiliary capacitance lines 38, the high voltage is first discharged to one of the gate common line 217, the source common line 219, and the auxiliary capacitance common line 39 and subsequently discharged to another two of the gate common line 217, the source common line 219, and the auxiliary capacitance common line 39. Furthermore, the first common line protection circuit 233A is disposed between the auxiliary capacitance common line 39 and the gate common line 217 and the second common line protection circuit 233B is disposed between the auxiliary capacitance common line 39 and the source common line 219. Therefore, the high voltage that is discharged to one of the gate common line 217, the source common line 219, and the auxiliary common line 39 is discharged to another two of the gate common line 217, the source common line 219, and the auxiliary capacitance common line 39 while being attenuated by the first common line protection circuit 233A and the second common line protection circuit 233B. Accordingly, the high voltage caused by ESD can be effectively dispersed in a wide range while being effectively attenuated and the ESD resistance of the pixel TFT can be improved. On the other hand, since the common electrode is not connected to any of the gate common line 217, the source common line 219, and the auxiliary capacitance common line 39, the characteristics of the pixel TFT are less likely to be changed due to the charging of the common electrode.

As described earlier, the present embodiment includes the auxiliary capacitance lines 38, which are third lines, and the auxiliary capacitance common lines (third common line) 39. The auxiliary capacitance lines 38 extend to cross the source lines 215. The auxiliary capacitance common lines 39 are connected to the auxiliary capacitance lines 38, which are the third lines, and indirectly connected to the gate common line 217 and the source common line 219. However, the auxiliary capacitance common lines 39 are not connected to the common electrode 23. According to such a configuration, the auxiliary capacitance common line 39 connected to each of the auxiliary capacitance lines 38, which are the third lines, are connected indirectly to the gate common line 217 and the source common line 219. Therefore, a high voltage that is discharged from one of the gate lines 214, the source lines 215, and the auxiliary capacitance lines 38, which are the third lines, to one of the gate common line 217, the source common line 219, and the auxiliary capacitance common line 39 is to be discharged to another two of the gate common line 217, the source common line 219, and the auxiliary capacitance common line 39. According to such a configuration, the high voltage caused by ESD can be effectively dispersed in a wide range and the ESD resistance of the pixel TFT can be improved. Since the common electrode is not connected to any of the gate common line 217, the source common line 219, and the auxiliary capacitance common line 39, the characteristics of the pixel TFT are less likely to be changed due to the charging of the common electrode.

The common line protection circuits 233 are present between the auxiliary capacitance common liens 39 and the gate common lines 217 to connect them and between the auxiliary capacitance common lines 39 and the source common lines 219 to connect them; however, the common line protection circuits 233 are not connected to the common electrode 23. According to such a configuration, a high voltage that is discharged from one of the gate lines 214, the source lines 215, and the auxiliary capacitance lines 38, which are the third lines, to one of the gate common line 217, the source common line 219, and the auxiliary capacitance common line 39 is to be discharged another two of gate common line 217, the source common line 219, and the auxiliary capacitance common line 39 while being attenuated by the common line protection circuits 233. Compared to a configuration in which the gate common line 217, the source common line 219, and the auxiliary capacitance common line 39 are directly connected to each other, the ESD resistance of the pixel TFT can be improved because the high voltage is attenuated by the common line protection circuits 233.

The third lines are the auxiliary capacitance lines 38 that overlap the pixel electrodes via the gate insulator, which is the insulator. According to such a configuration, a potential of the pixel electrode charged by the pixel TFT is maintained by the auxiliary capacitance line 38 that overlaps the pixel electrode via the gate insulator, which is the insulator.

Fourth Embodiment

A fourth embodiment will be described with reference to FIGS. 16 to 18. In the fourth embodiment section, a producing process of producing an array substrate 310A differs from that in the first embodiment and a configuration of a flexible circuit board 313 is altered from that in the first embodiment. Configurations, operations, and effects similar to those of the first embodiment previously described will not be described.

Figure 16:
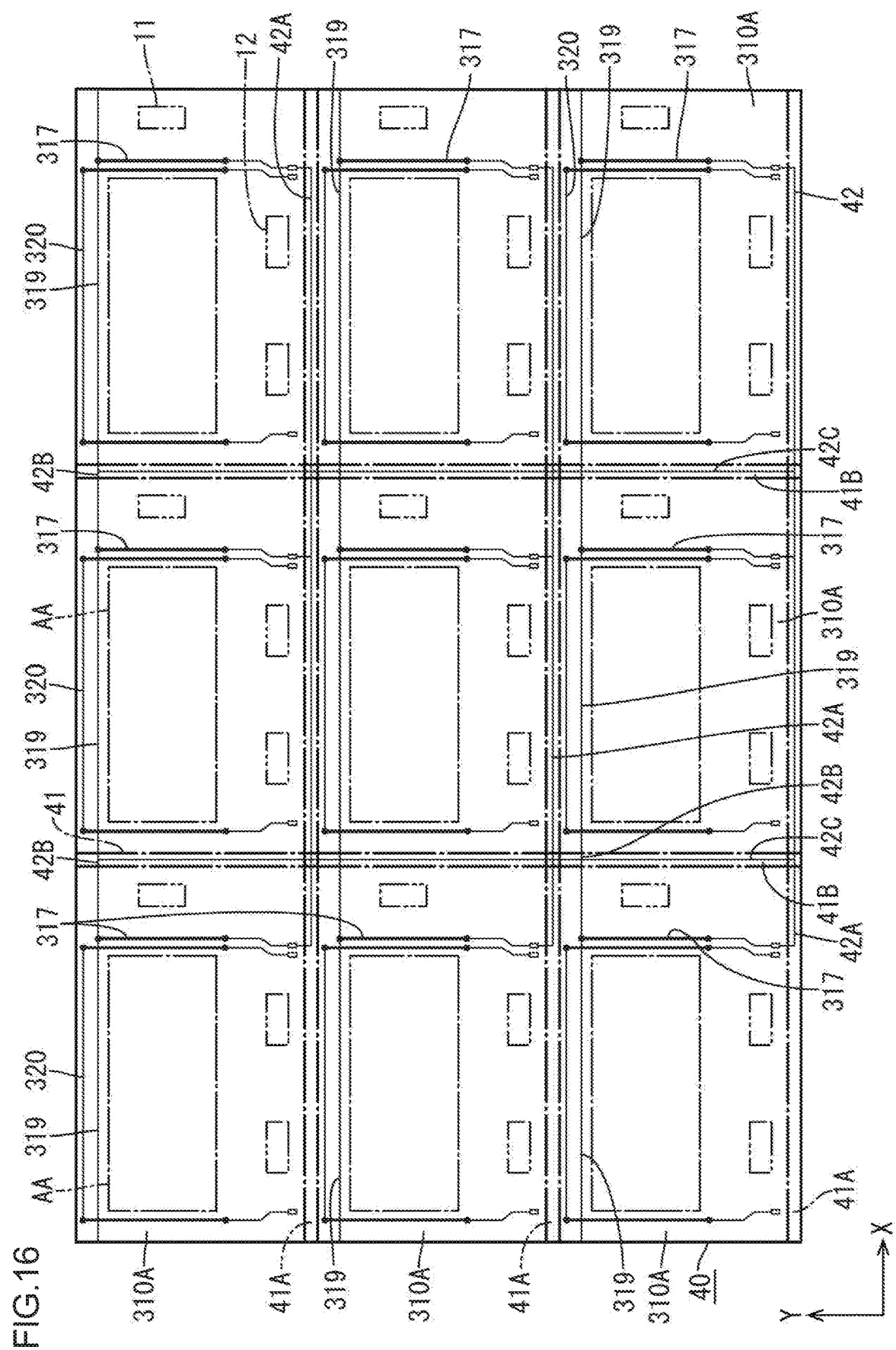
FIG. 16 is a plan view illustrating a circuit structure in an array substrate body component according to a fourth embodiment.
Figure 17:
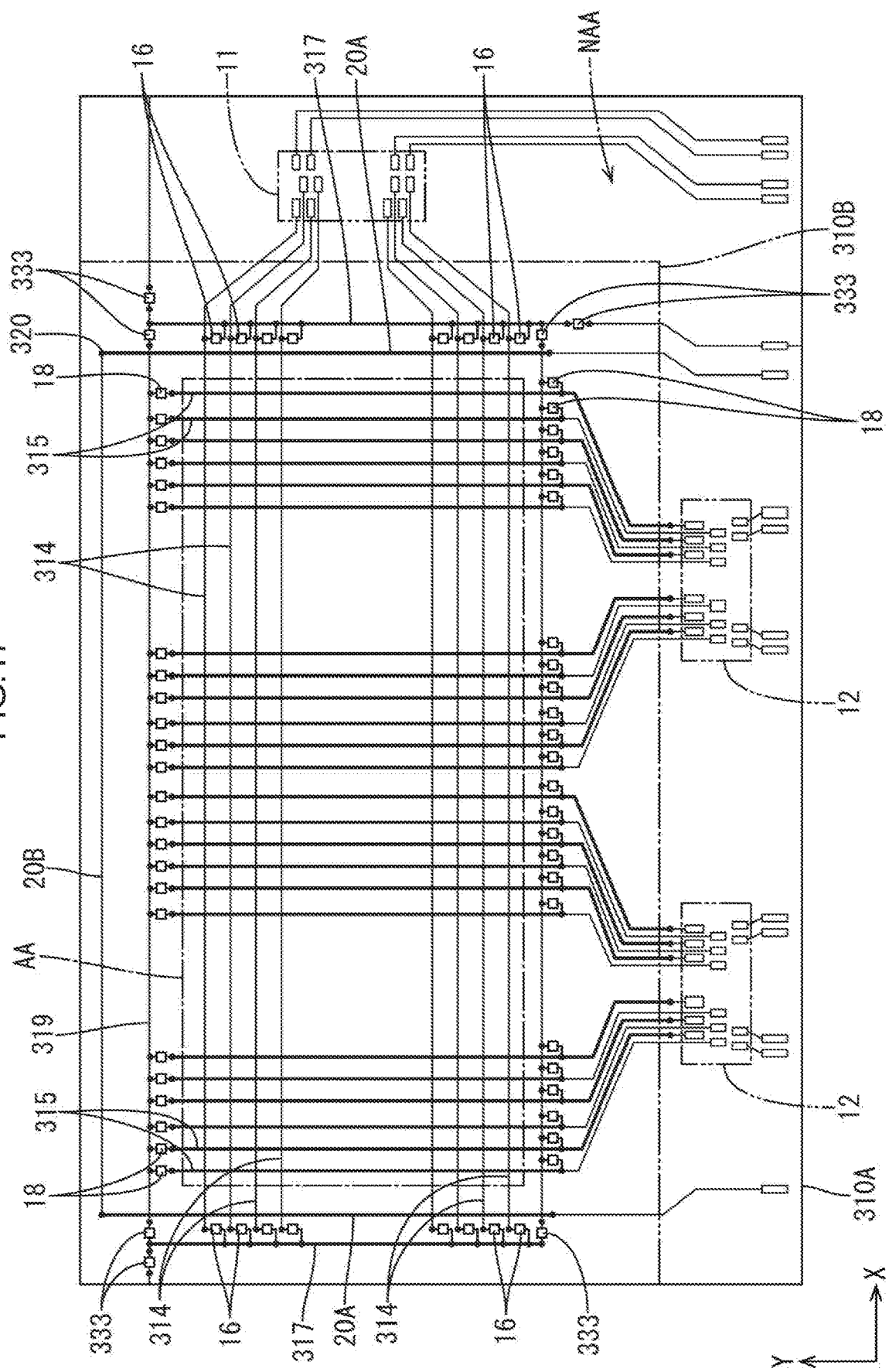
FIG. 17 is a plan view illustrating a circuit structure in the array substrate.

As illustrated in FIG. 16, the array substrates 310A are included in a large-sized array substrate body component 40 and the array substrate body component 40 is subjected to various kinds of processes by various producing devices. The array substrate body component 40 is referred to as a mother array substrate. Although not illustrated, in producing a liquid crystal panel, a CF substrate body component (a counter substrate body component) including CF substrates 310B (see FIG. 18) is subjected to various kinds of processes by various producing devices. After the array substrate body component 40 and the CF substrate body component are bonded to each other to produce a liquid crystal panel body component (a display device body component), a cutting process is performed in a cutting step to produce liquid crystal panels 310 (see FIG. 18). In FIG. 16, a cutting line along which the cutting process is performed in the cutting step is illustrated with bold chain lines.

As illustrated in FIG. 16, the array substrate body component 40 in this embodiment includes a total of nine array substrates 310A that are arranged side by side and arranged in a grid. The array substrate body component 40 includes inter-substrate portions 41 that are present between the array substrates 310A adjacent to each other in the X-axis direction and the Y-axis direction and connect them. The inter-substrate portions 41 are to be cut away and removed when cutting the array substrate body component 40 in the cutting step. The inter-substrate portions 41 are not included in each array substrate 310A and is referred to as an extra substrate portion. The inter-substrate portions 41 include a first inter-substrate portion 41A and a second inter-substrate portion 41B. The first inter-substrate portion 41A is between the array substrates 310A that are adjacent to each other with respect to the Y-axis direction. The second inter-substrate portion 41B is between the array substrates 310A that are adjacent to each other with respect to the X-axis direction. The first inter-substrate portion 41A has a laterally-long shape extending along the X-axis direction. The first inter-substrate portion 41A includes one that is included continuously from the array substrate 310A at a lowest position in FIG. 16. The second inter-substrate portion 41B has a vertically-long shape extending along the Y-axis direction.

As illustrated in FIG. 16, the inter-substrate portion 41 includes an inter-substrate connection line 42 that connects gate common lines 317 and connects source common lines 319 included in the adjacent array substrates 310A of the array substrate body component 40. The inter-substrate connection line 42 includes a first inter-substrate connection line 42A, a second inter-substrate connection line 42B, and a third inter-substrate connection line 42C. The first inter-substrate connection line 42A connects the gate common lines 317. The second inter-substrate connection line 42B connects the source common lines 319. The third inter-substrate connection line 42C connects the first inter-substrate connection lines 42A and connects the second inter-substrate connection lines 42B. The first inter-substrate connection line 42A is disposed on the first inter-substrate portion 41A and extends along the X-axis direction that is a longitudinal direction of the first inter-substrate portion 41A. The first inter-substrate connection line 42A is connected to the gate common lines 317 that are included in the array substrates 310A that are adjacent to each other in the X-axis direction. The second inter-substrate connection line 42B is disposed on the second inter-substrate portion 41B and extends along the X-axis direction that is a width direction of the second inter-substrate portion 41B. The second inter-substrate connection line 42B is connected to the source common lines 319 that are included in the array substrates 310A that are adjacent to each other in the X-axis direction. The third inter-substrate connection line 42C is disposed on the second inter-substrate portion 41B and extends along the Y-axis direction that is a longitudinal direction of the second inter-substrate portion 41B. The third inter-substrate connection line 42C is connected to the first inter-substrate connection line 42A and the second inter-substrate connection line 42B that cross each other. The first inter-substrate connection line 42A, the second inter-substrate connection line 42B, and the third inter-substrate connection line 42C are sections of a first metal film. As illustrated in FIG. 17, the gate common line 317 extends from a terminal on the array substrate 310A to an edge of the array substrate 310A that is a border from the first inter-substrate portion 41A so as to be connected to the first inter-substrate connection lines 42A. Similarly, the source common line 319 extends to an edge of the array substrate 310A that is a border from the second inter-substrate portion 41B so as to be connected to the second inter-substrate connection lines 42B. The common line protection circuit 333 is present between the extended portion of the source common line 319 and the gate common line 317.

According to such a configuration, the array substrate body component 40 is subjected to various processes with various types of producing devices when producing the array substrate 310A, and in the various processes, if a high voltage caused by ESD is input to the gate line 314 and the source line 315 included in the array substrate 310A, the high voltage is first discharged to the gate common line 317 and the source common line 319 included in the array substrate 310A. The gate common lines 317 included in the adjacent array substrates 310A are connected to each other with the first inter-substrate connection line 42A and the source common lines 319 included in the adjacent array substrates 310A are connected to each other with the second inter-substrate connection line 42B. Further, the first inter-substrate connection line 42A and the second inter-substrate connection line 42B are connected to each other with the third inter-substrate connection line 42C. According to such a configuration, the high voltage is discharged to the gate common lines 317 and the source common lines 319 included in all of the array substrates 310A included in the array substrate body component 40. Further, the high voltage is also discharged to the first inter-substrate connection line 42A, the second inter-substrate connection line 42B, and the third inter-substrate connection line 42C. Thus, a high voltage caused by ESD can be dispersed effectively in a wide range and the ESD resistance of the pixel TFT can be improved.

Figure 18:
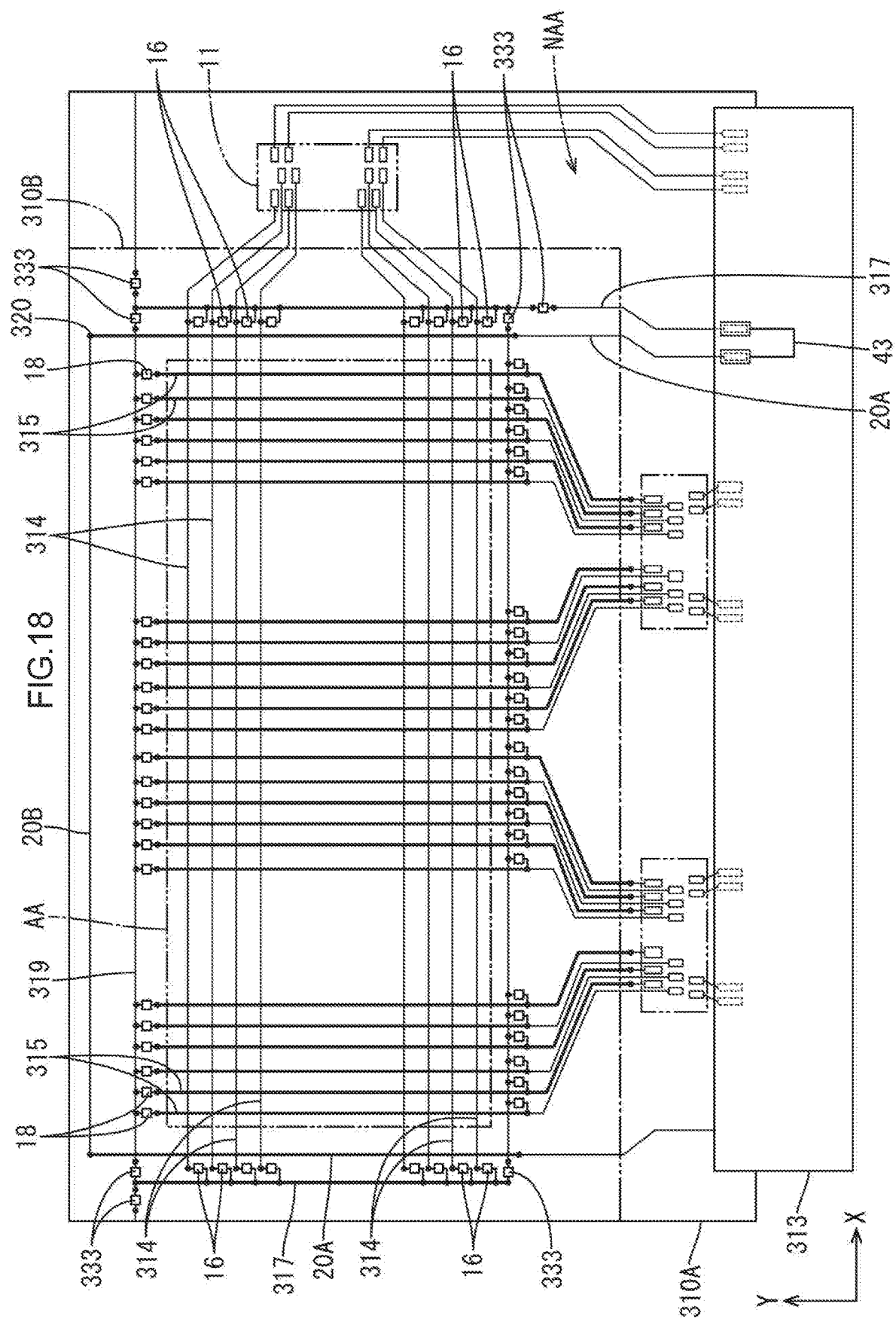
FIG. 18 is a plan view illustrating a circuit structure included in the array substrate that is connected to a flexible circuit board.

FIG. 18 is a plan view of the array substrate 310A on which the flexible circuit board 313 is mounted. The CF substrate 310B is illustrated with a chain double-dashed line in FIG. 18. The flexible circuit board 313 includes a short-circuit line 43 that short-circuits the common electrode line 320 and the gate common line 317. The short-circuit line 43 includes a pair of terminals and a short-circuit line section that connects the pair of terminals. The terminals of the short-circuit line 43 are connected to terminals on the array substrate 310A, namely, connected to a terminal connected to an end of the common electrode line 320 and a terminal connected to an end of the gate common line 317. According to such a configuration, the common electrode included in the array substrate 310A is short-circuited to the gate common line 317 via the common electrode line 320 and the short-circuit line 43. Therefore, even if a high voltage caused by ESD is input to the gate line 314 or the source line 315, the high voltage can be dispersed in a wide range through the gate common line 317, the source common line 319, the common electrode line 320, and the common electrode. Thus, the ESD resistance of the pixel TFT can be further improved. The flexible circuit board 313 including the short-circuit line 43 is to be connected to the array substrate 310A after the array substrate 310A is produced. Therefore, during the process of producing the array substrate 310A in which the charging may be caused in the common electrode, the common electrode and the common electrode line 320 are not connected to the gate common line 317 and the source common line 319.

As described earlier, the array substrate body component 40 in the present embodiment includes the array substrates 310A that are continuous to each other. The gate common lines 317 that are included in the adjacent array substrates 310A or the source common lines 319 that are included in the adjacent array substrates 310A are connected to each other. According to such an array substrate body component 40, since the gate common lines 317 that are included in the adjacent array substrates 310A or the source common lines 319 that are included in the adjacent array substrates 310A are connected to each other, a high voltage caused by ESD can be discharged through the gate common lines 317 that are connected to each other or the source common lines 319 that are connected to each other. Thus, a high voltage caused by ESD can be dispersed in a wider range and accordingly, the ESD resistance of the pixel TFT can be improved.

The inter-substrate portions 41 that are present between the adjacent array substrates 310A and connect them and the inter-substrate connection line 42 that is present on the inter-substrate portion 41 and connects the gate common lines 317 on the adjacent array substrates 310A or the source common lines 319 on the adjacent array substrates 310A. According to such a configuration, the adjacent array substrates 310A are joined each other by the inter-substrate portion 41 that is present therebetween. Thus, the gate common lines 317 on the adjacent array substrates 310A or the source common lines 319 on the adjacent array substrates 310A are connected to each other by the inter-substrate connection line 42 disposed on the inter-substrate portion 41 so that a high voltage caused by ESD can be dispersed in a wide range. The inter-substrate portions 41 are to be cut away and separated from each array substrate 310A when the array substrate body component 40 is divided into the array substrates 310A.

The inter-substrate connection line 42 includes the first inter-substrate connection line 42A, the second inter-substrate connection line 42B, and the third inter-substrate connection line 42C. The first inter-substrate connection line 42A connects the gate common lines 317 included in the adjacent array substrates 310A. The second inter-substrate connection line 42B connects the source common lines 319 included in the adjacent array substrates 310A. The third inter-substrate connection line 42C is connected to the first inter-substrate connection line 42A and the second inter-substrate connection line 42B. Accordingly, the first inter-substrate connection line 42A, which connects the gate common lines 317, and the second inter-substrate connection line 42B, which connects the source common liens 319, are connected to the third inter-substrate connection line 42C. Therefore, a high voltage caused by ESD can be dispersed in a wider range. The ESD resistance of a pixel TFT can be further improved.

The liquid crystal panel 310 in the present embodiment includes the flexible circuit board (a connection part) 313 that is to be connected to the array substrate 310A and the flexible circuit board 313 includes the short-circuit line 43 that short-circuits the common electrode and the gate common line 317. Thus, the common electrode and the gate common line 317 are short-circuited via the short-circuit line 43 and accordingly, if ESD is caused in the array substrate 310A that is connected to the flexible circuit board 313, a high voltage caused by ESD can be dispersed in a wide range via the gate common line 317, the source common line 319, and the common electrode. Thus, the ESD resistance of a pixel TFT can be further improved. The flexible circuit board 313 including the short-circuit line 43 is to be connected to the array substrate 310A after the array substrate 310A is produced. Therefore, during a process of producing the array substrate 310A in which charging may be caused in the common electrode, the common electrode is not connected to the gate common line 317 and the source common line 319.

Other Embodiments

The present technology is not limited to the embodiments described above and illustrated by the drawings. For example, the following embodiments will be included in the technical scope of the present technology.

Figure 19:
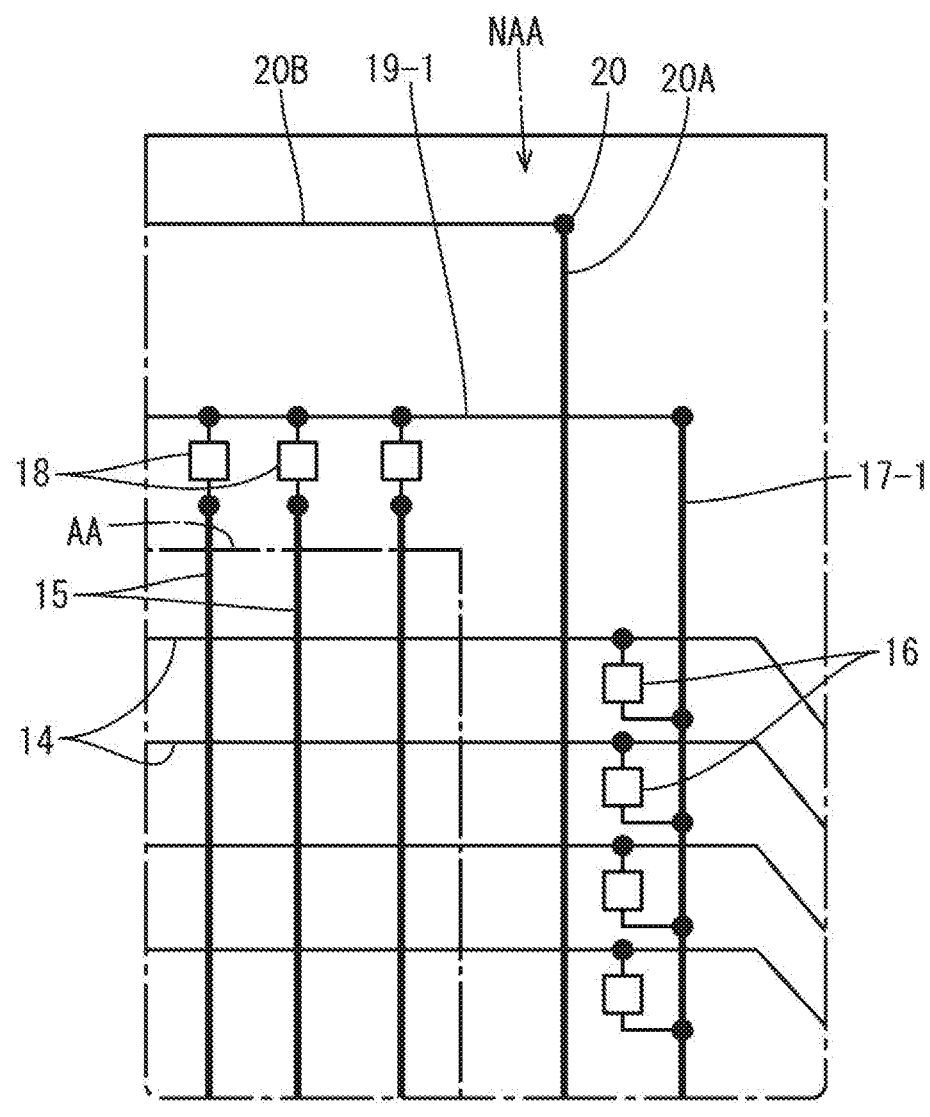
FIG. 19 is a plan view illustrating a circuit structure near a corner section of the array substrate according to another embodiment (1).

(1) The first, second, and fourth embodiments described earlier includes the common line protection circuit that is present between the gate common line and the source common line and connect them. However, the common line protection circuit may not be included. In such a configuration, as illustrated in FIG. 19, a gate common line 17-1 and a source common line 19-1 are directly connected to each other. Specifically, the gate common line 17-1 is a section of the second metal and the source common line 19-1 is a section of the first metal film, and a gate insulator that is between the gate common line 17-1 and the source common line 19-1 preferably includes a contact hole thorough which the gate common line 17-1 and the source common line 19-1 are connected to each other.

(2) The third embodiment includes the first common line protection circuit that is disposed between the gate common line and the auxiliary capacitance common line and connect them and the second common line protection circuit that is disposed between the source common line and the auxiliary capacitance common line and connect them. However, the first common line protection circuit and the second common line protection circuit may not be included. In such a configuration, similar to the earlier described (1), the gate common line and the source common line are preferably connected to the auxiliary capacitance line directly. One of the first common line protection circuit and the second common line protection circuit may be omitted.

(3) Other than each of the above embodiments, a specific circuit structure (connection relation of the transistors) of the protection circuits may be altered as appropriate.

(4) In each of the above embodiments, each protection circuit includes transistors as a protection circuit component. However, each protection circuit may include a protection circuit component other than the transistor. For example, each protection circuit may include a Zener diode or a varistor as the protection circuit component.

(5) In each of the above embodiments, a pair of the gate common lines and a pair of the source common lines are included in the array substrate; however, one gate common line or/and one source common line may be included in the array substrate. In such a configuration, the number of one of or both of the first protection circuits and the second protection circuits can be reduced to a half.

(6) In the third embodiment, the array substrate includes a pair of auxiliary capacitance common lines; however, the array substrate may include one auxiliary capacitance common line.

(7) The configuration of the third embodiment including the auxiliary capacitance line and the auxiliary capacitance common line may be applied to the configuration of the second embodiment.

(8) The configuration of the fourth embodiment that the array substrate body component includes the inter-substrate portion and the inter-substrate connection line or the configuration that the flexible circuit board includes the short-circuit line may be applied to the configuration of each of the second embodiment and the third embodiment.

(9) In the fourth embodiment, the inter-substrate connection line includes the first inter-substrate connection line, the second inter-substrate connection line, and the third inter-substrate connection line. However, any one or two of the first inter-substrate connection line, the second inter-substrate connection line, and the third inter-substrate connection line may be omitted. In such a configuration, the first inter-substrate portion or the second inter-substrate portion where no inter-substrate connection line is disposed may be omitted. If only the third inter-substrate connection line is omitted, the first inter-substrate connection line is not connected to the second inter-substrate connection line. If any one of the first inter-substrate connection line and the second inter-substrate connection line is omitted, another one of the first inter-substrate connection lines and the second inter-substrate connection lines are connected to each other by the third inter-substrate connection line.

(10) Other than the above (9), the inter-substrate portion and the inter-substrate connection line may be omitted. In such a configuration, for example, the source common lines included in the array substrates that are adjacent to each other in the X-axis direction may be directly connected to each other, or the gate common lines included in the array substrates that are adjacent to each other in the Y-axis direction may be directly connected to each other.

(11) In the fourth embodiment, the short-circuit line included in the flexible circuit board short-circuits the common electrode line and the gate common line; however, the short-circuit line may be configured to short-circuit the common electrode line and the source common line. If the configuration of the fourth embodiment is applied to the configuration of the third embodiment, the short-circuit line may be configured to short-circuit the common electrode line and the auxiliary capacitance common line.

(12) The fourth embodiment includes the array substrate body component including a total of nine array substrates that are arranged in a grid. However, the specific number and arrangement of the array substrates included in the array substrate body component may be altered as appropriate.

(13) In each of the above embodiments, the gate driver and the source driver are mounted on the array substrate; however, the gate driver may be omitted. In such a configuration, a GDM circuit for supplying scanning signals to each of the gate lines may be mounted on the array substrate in a monolithic manner or a film on which a gate driver is mounted with the chip-on-film (COF) mounting method may be connected to the array substrate; however, it is not limited thereto. The source driver may be omitted. In such a configuration, a film on which a source driver is mounted with the COF mounting method may be connected to the array substrate; however, it is not limited thereto. A specific number or a specific position of each of the gate driver and the source driver may be altered as appropriate.

(14) In each of the above embodiments, the common electrode is disposed in an upper layer than the pixel electrode; however, the common electrode may be disposed in a lower layer than the pixel electrode.

(15) In each of the above embodiments, the common electrode includes the slits; however, the pixel electrode may include slits.

(16) In each of the above embodiments, the semiconductor film is made of amorphous silicon or the oxide semiconductor. However, the semiconductor film may be made of polycrystalline silicone.

(17) In each of the above embodiments, the liquid crystal panel has a rectangular planar shape; however, a liquid crystal panel having a planar shape of a square, a circle, or an oval may be used.

(18) Each of the above embodiments includes the TFTs as switching components of the liquid crystal panel. However, liquid crystal panels that include switching components other than TFTs (e.g., thin film diodes (TFDs)) may be included in the scope of the present technology. Furthermore, black-and-white liquid crystal panels, other than color liquid crystal panel, are also included in the scope of the present technology.

(19) In each of the above embodiments, the liquid crystal panel includes the liquid crystal layer that is sandwiched between the pair of substrates; however, a display panel including functional organic molecules other than the liquid crystal material between the pair of substrates is included in the scope of the present technology.

(20) In each of the above embodiments, the liquid crystal panel is described as the embodiments. However, other types of display panels (e.g., organic EL panels and electrophoretic display panels (EPD) are also included in the scope of the present technology.

The invention claimed is:

1. An array substrate comprising:
switching components;
pixel electrodes connected to the switching components;
a common electrode disposed to overlap the pixel electrodes via an insulator;
first lines connected to the switching components;
second lines connected to the switching components and extending such that the second lines cross the first lines;
first protection circuits, each connected to a corresponding one of the first lines;
second protection circuits, each connected to a corresponding one of the second lines;
a first common line connected to the first lines via the first protection circuits and extending in a first direction, the first common line not connected to the common electrode;
a second common line connected to the second lines via the second protection circuits and extending in a second direction that is perpendicular to the first direction, the second common line connected to the first common line and not connected to the common electrode;
a first common electrode line extending in the first direction and insulated from the first common line and connected to the common electrode;
a second common electrode line extending in the second direction and insulated from the second common line and connected to the common electrode;
wherein:
the first lines include first end portions and second end portions, the second end portions opposite the first end portions;
the first common line includes at least two first common lines including a right first common line and a left first common line;
the first protection circuits include a first group of first protection circuits and a second group of first protection circuits;
the first group of first protection circuits are connected to the first end portions and the right first common line;
the second group of first protection circuits are connected to the second end portions and the left first common line;
the second lines include third end portions and fourth end portions, the fourth end portions opposite the third end portions;
the second common line includes at least two second common lines including an upper second common line and a lower second common line;
the second protection circuits include a first group of second protection circuits and a second group of second protection circuits;
the first group of second protection circuits are connected to the third end portions and the upper second common line; and
the second group of second protection circuits are connected to the fourth end portions and the lower second common line.

2. The array substrate according to claim 1, further comprising a common line protection circuit that is disposed between the first common line and the second common line to connect the first common line to the second common line and is not connected to the common electrode.

3. The array substrate according to claim 2, wherein:
the common line protection circuit includes a first transistor and a second transistor;
the first transistor includes:
a first gate electrode and a first source electrode that are connected to the first common line;
a first channel region that is connected to the first source electrode; and
a first drain electrode that is connected to a portion of the first channel region opposite from a portion connected to the first source electrode; and
the second transistor includes:
a second gate electrode and a second source electrode that are connected to the second common line and the first drain electrode;
a second channel region that is connected to the second source electrode; and
a second drain electrode that is connected to a portion of the second channel region opposite from a portion connected to the second source electrode and is connected to the first gate electrode and the first source electrode.

4. The array substrate according to claim 1, wherein the common electrode is disposed at a higher layer than the pixel electrodes.

5. A display device comprising:
the array substrate according to claim 1; and
a counter substrate opposite to the array substrate.

6. The array substrate according to claim 1, wherein each of the right first common line and the left first common line is connected to both the upper second common line and the lower second common line.

7. The array substrate according to claim 1, wherein:
the second common electrode line includes two ends;
the first common electrode line includes at least two first common electrode lines;
the two first common electrode lines include a right first common electrode line and a left first common electrode line; and
the right first common electrode line and the left first common electrode line are each connected to one of the two ends of the second common electrode line.

* * * * *